(12) United States Patent
Wu et al.

(10) Patent No.: US 12,401,012 B2
(45) Date of Patent: *Aug. 26, 2025

(54) SEMICONDUCTOR DEVICE PACKAGE AND METHODS OF MANUFACTURE

(71) Applicant: Taiwan Semiconductor Manufacturing Co., Ltd., Hsinchu (TW)

(72) Inventors: Jiun Yi Wu, Zhongli (TW); Chen-Hua Yu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/361,568

(22) Filed: Jul. 28, 2023

(65) Prior Publication Data

US 2023/0378150 A1 Nov. 23, 2023

Related U.S. Application Data

(63) Continuation of application No. 17/186,726, filed on Feb. 26, 2021, now Pat. No. 11,756,945.

(51) Int. Cl.
*H01L 23/538* (2006.01)
*H01L 21/48* (2006.01)
(Continued)

(52) U.S. Cl.
CPC .......... *H01L 25/18* (2013.01); *H01L 21/4857* (2013.01); *H01L 23/5383* (2013.01); *H01L 23/5385* (2013.01); *H01L 24/16* (2013.01); *H01L 24/17* (2013.01); *H01L 25/50* (2013.01); *H01L 2224/16227* (2013.01); *H01L 2224/17177* (2013.01)

(58) Field of Classification Search
CPC . H01L 25/18; H01L 21/4857; H01L 23/5383; H01L 23/5385; H01L 24/16; H01L 24/17; H01L 2224/16227; H01L 25/50; H01L 2224/17177

See application file for complete search history.

(56) References Cited

U.S. PATENT DOCUMENTS 11,756,945 B2 * 9/2023 Wu .......................... H01L 24/17 257/668
2016/0073516 A1 3/2016 Chou et al.
(Continued)

*Primary Examiner* — Thanh Y. Tran
(74) *Attorney, Agent, or Firm* — Slater Matsil, LLP

(57) ABSTRACT

A method includes forming a redistribution structure on a carrier substrate, coupling a first side of a first interconnect structure to a first side of the redistribution structure using first conductive connectors, where the first interconnect structure includes a core substrate, where the first interconnect structure includes second conductive connectors on a second side of the first interconnect structure opposite the first side of the first interconnect structure, coupling a first semiconductor device to the second side of the first interconnect structure using the second conductive connectors, removing the carrier substrate, and coupling a second semiconductor device to a second side of the redistribution structure using third conductive connectors, where the second side of the redistribution structure is opposite the first side of the redistribution structure.

20 Claims, 17 Drawing Sheets

(51) Int. Cl.
  *H01L 23/00*   (2006.01)
  *H01L 25/00*   (2006.01)
  *H01L 25/18*   (2023.01)

(56) References Cited

U.S. PATENT DOCUMENTS

| | | |
|---|---|---|
| 2019/0393149 A1 | 12/2019 | Wang et al. |
| 2020/0251397 A1 | 8/2020 | Lai et al. |
| 2020/0395347 A1* | 12/2020 | Yu .......................... G02B 6/122 |
| 2021/0272892 A1* | 9/2021 | Zhang ................. H01L 25/0657 |
| 2022/0051959 A1* | 2/2022 | Lee ................... H01L 21/76802 |
| 2022/0068746 A1* | 3/2022 | Chen ....................... H01L 24/19 |
| 2022/0157744 A1* | 5/2022 | Chiang ................... H01L 24/16 |
| 2022/0216071 A1* | 7/2022 | Chen ................... H01L 21/4853 |
| 2022/0230969 A1* | 7/2022 | Yeh ......................... H01L 23/24 |

* cited by examiner

SEMICONDUCTOR DEVICE PACKAGE AND METHODS OF MANUFACTURE

CROSS-REFERENCE TO RELATED APPLICATIONS

This application is a continuation of U.S. application Ser. No. 17/186,726, filed on Feb. 26, 2021, now U.S. Pat. No. 11,756,945, issued Sep. 12, 2023, which application is hereby incorporated herein by reference.

BACKGROUND

The semiconductor industry continues to improve the integration density of various electronic components (e.g., transistors, diodes, resistors, capacitors, etc.) by continual reductions in minimum feature size, which allow more components, hence more functions, to be integrated into a given area. Integrated circuits with high functionality require many input/output pads. Yet, small packages may be desired for applications where miniaturization is important.

Integrated Fan Out (InFO) package technology is becoming increasingly popular, particularly when combined with Wafer Level Packaging (WLP) technology in which integrated circuits are packaged in packages that typically include a redistribution layer (RDL) or post passivation interconnect that is used to fan-out wiring for contact pads of the package, so that electrical contacts can be made on a larger pitch than contact pads of the integrated circuit. Such resulting package structures provide for high functional density with relatively low cost and high performance packages.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
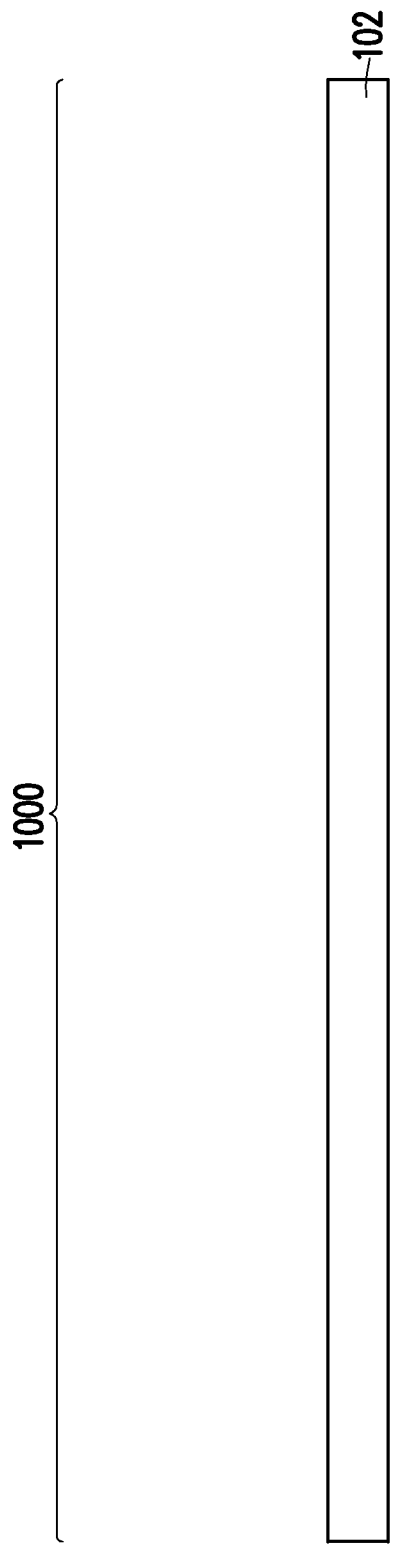
FIGS. 1-5 illustrate cross-sectional views of intermediate steps of forming a device package, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide methods applied to, but not limited to, the formation of a device package in which component devices (e.g., integrated fan-out (InFO) packages, chip-on-wafer (CoW) packages, or the like) are bonded on opposite sides of a core substrate to form a system on integrated substrate (SoIS). The core substrate may include an organic substrate, and the core substrate may be part of a pre-fabricated interconnect structure that comprises pre-soldered controlled collapse chip connection (C4) bumps. Advantageous features of one or more embodiments disclosed herein may include the ability to electrically connect and integrate a higher number of component devices within the device package. In addition, because of the compact structure of the device package, the package components are closer to each other which results in better power and signal integrity with reduced transmission losses. This leads to better computing performance and allows the use of the device package in applications that require faster processing of data and performing of complex calculations at high speeds (e.g., High-Performance-Computing (HPC)).

Figure 11:
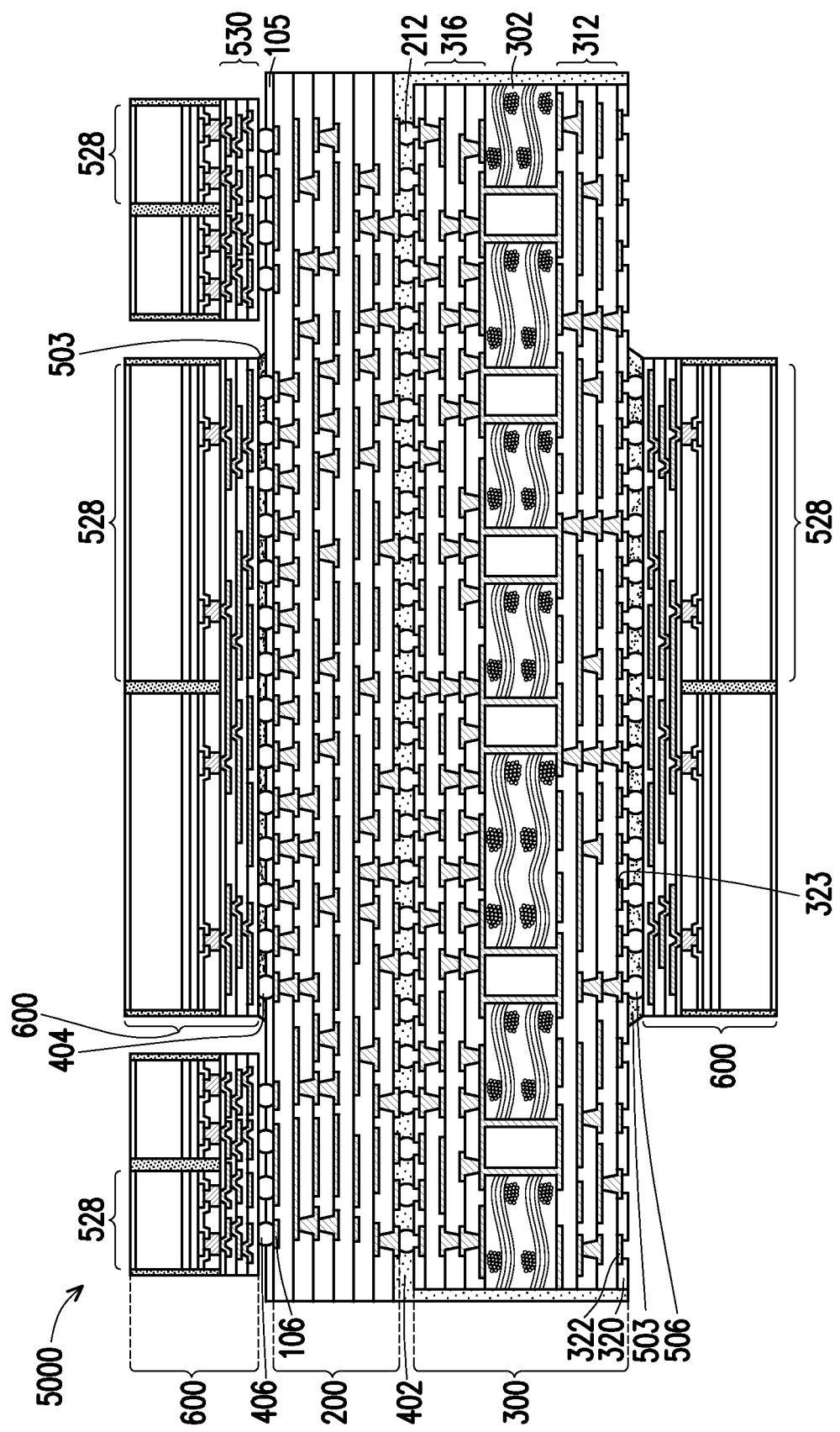
FIGS. 11-12 illustrate cross-sectional views of intermediate steps of forming a device package, in accordance with alternative embodiments.
Figure 12:
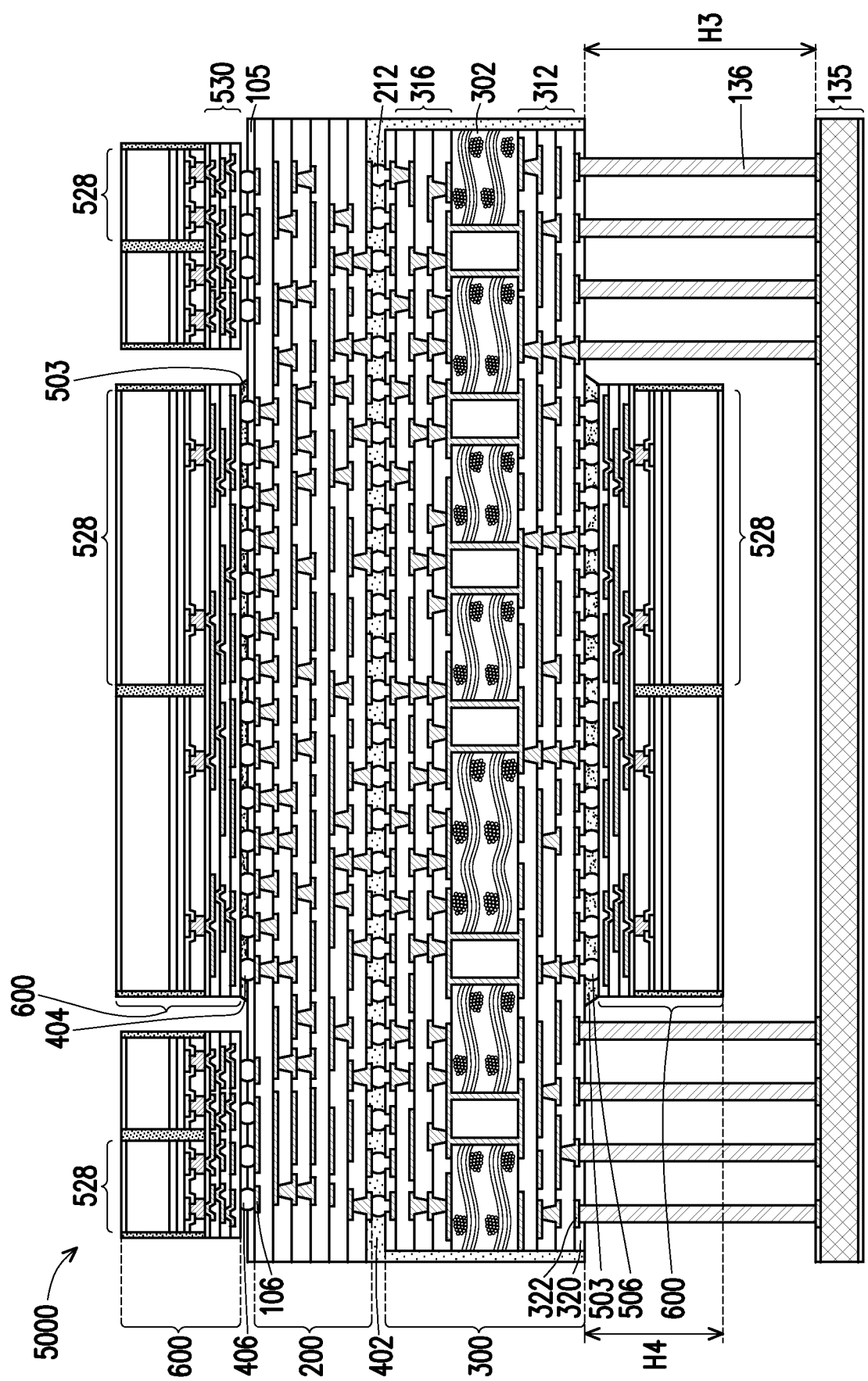
Figure 13:
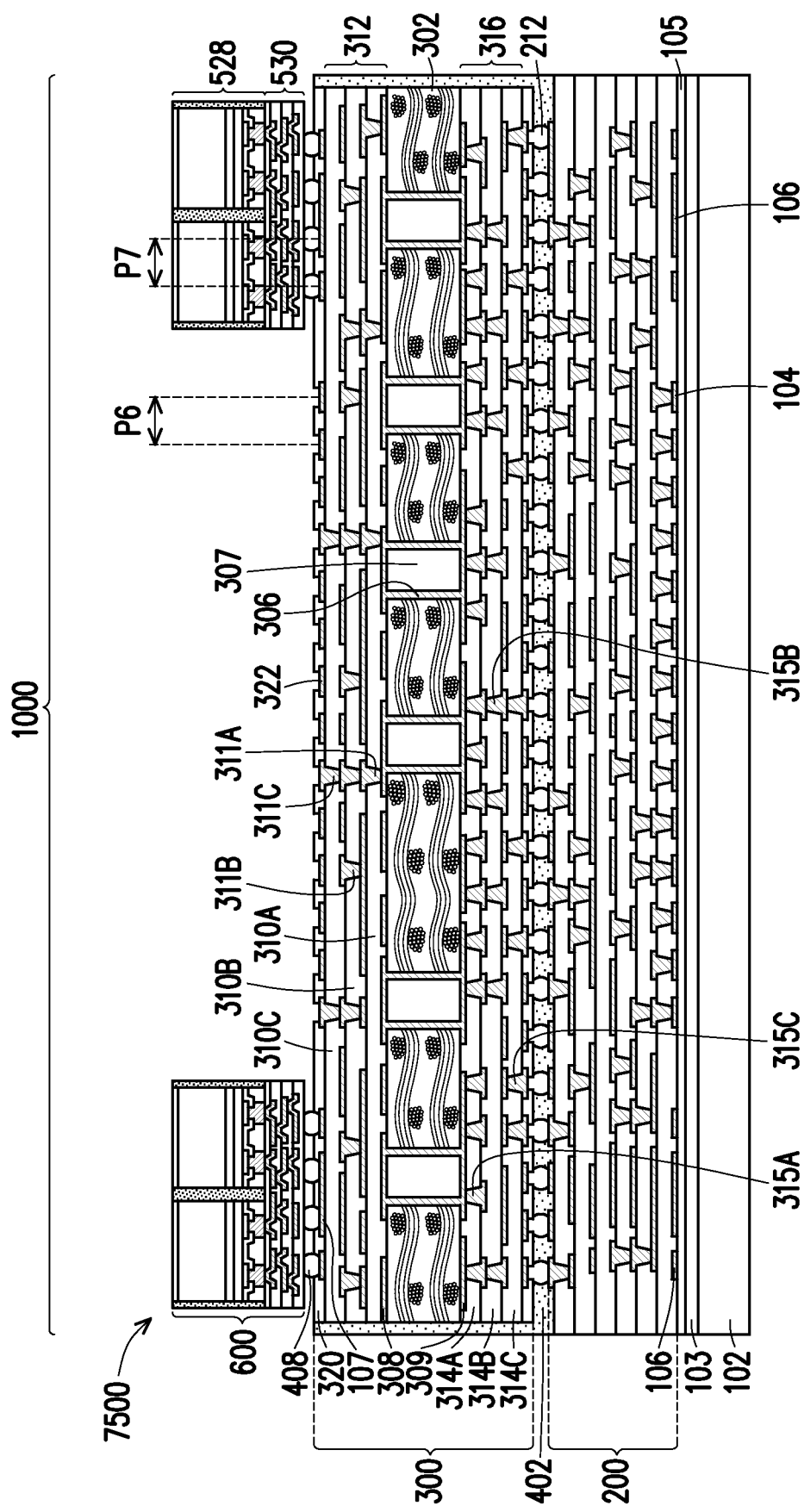
FIGS. 13-15 illustrate cross-sectional views of intermediate steps of forming a device package, in accordance with alternative embodiments.
Figure 14:
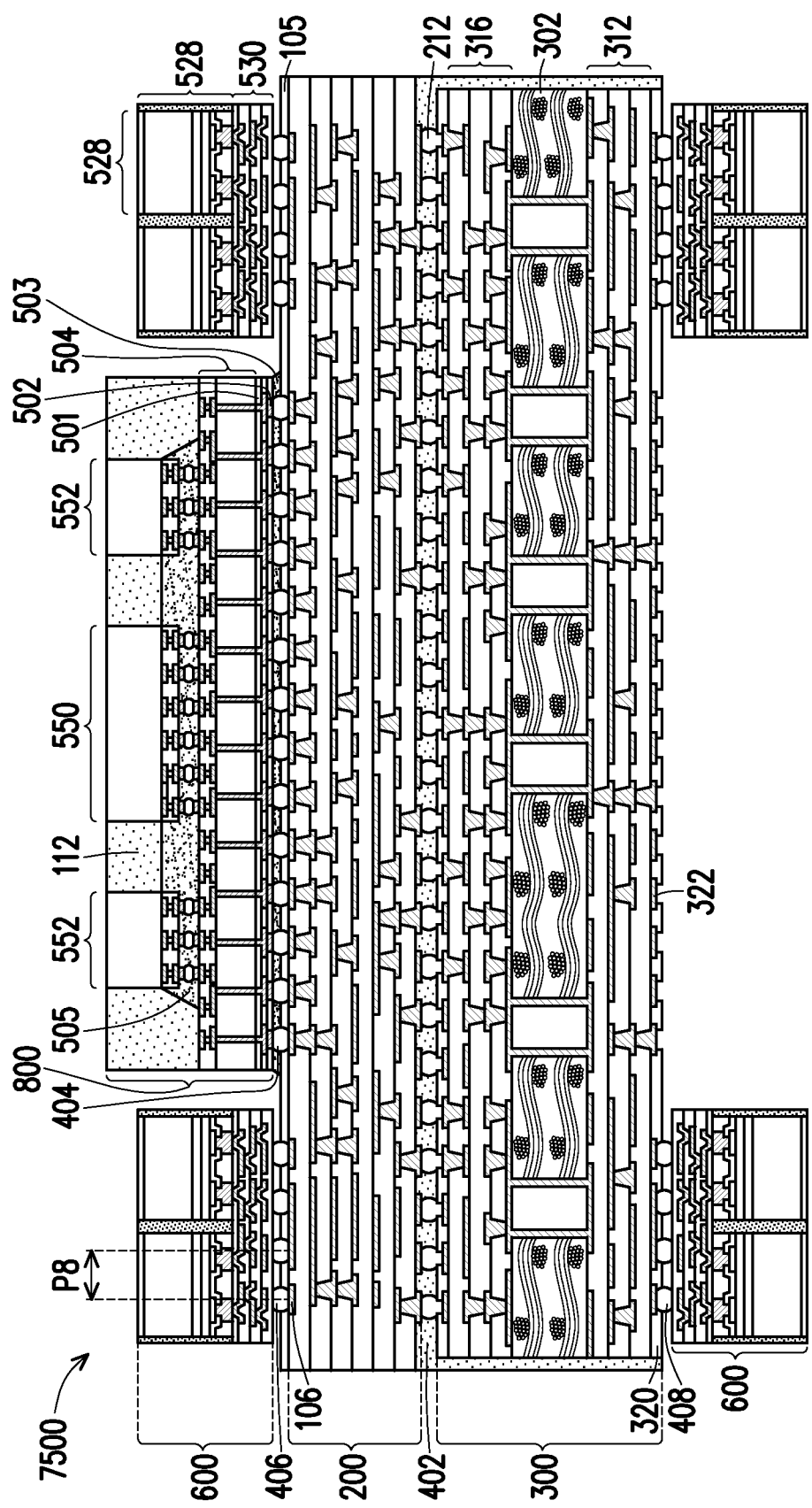
Figure 15:
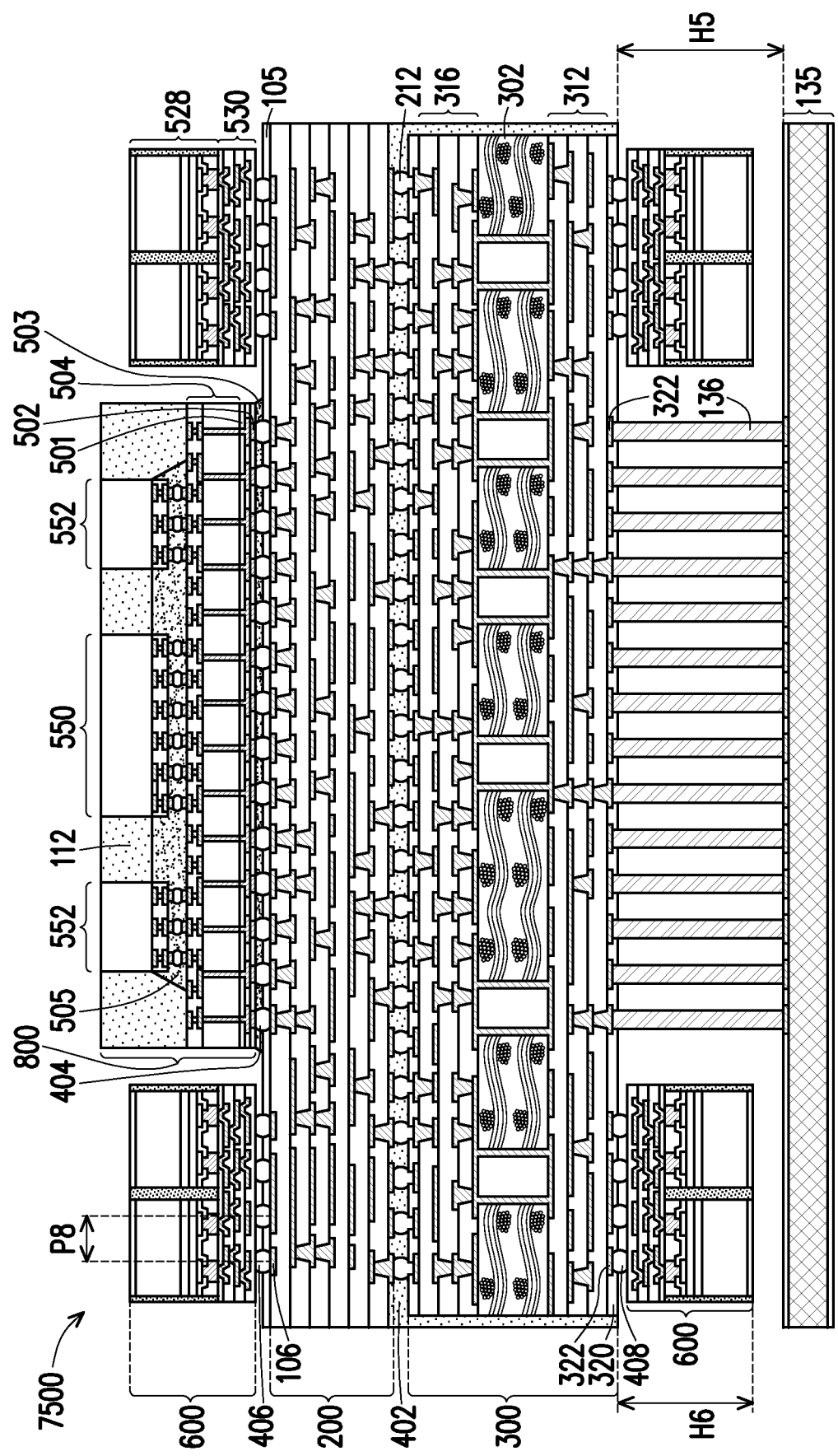

FIGS. 1-5 and 7A-10 illustrate cross-sectional views of intermediate steps of forming a device package 2500, in accordance with some embodiments. FIGS. 6A-6B illustrate top views of the layout of package regions in accordance with some embodiments. FIGS. 11-12 illustrate cross-sectional views of intermediate steps of forming a device package 5000, in accordance with some embodiments. FIGS. 13-15 illustrate cross-sectional views of intermediate steps of forming a device package 7500, in accordance with some embodiments.

In FIG. 1, a first package region 1000 of a carrier substrate 102 is shown. The carrier substrate 102 may comprise silicon-based materials, such as a silicon substrate (e.g., a silicon wafer), a glass material, silicon oxide, or other materials, such as aluminum oxide, the like, or a combination. In some embodiments, the carrier substrate 102 may be a panel structure, which may be, for example, a supporting substrate formed from a suitable dielectric material, such as a glass material or an organic material, and which may have a rectangular shape. The carrier substrate 102 may be planar in order to accommodate the formation of additional features subsequently formed thereon. The carrier substrate 102 may comprise a plurality of first package regions 1000 on which package components are fabricated. The package regions 1000 may subsequently be singulated.

Figure 2:
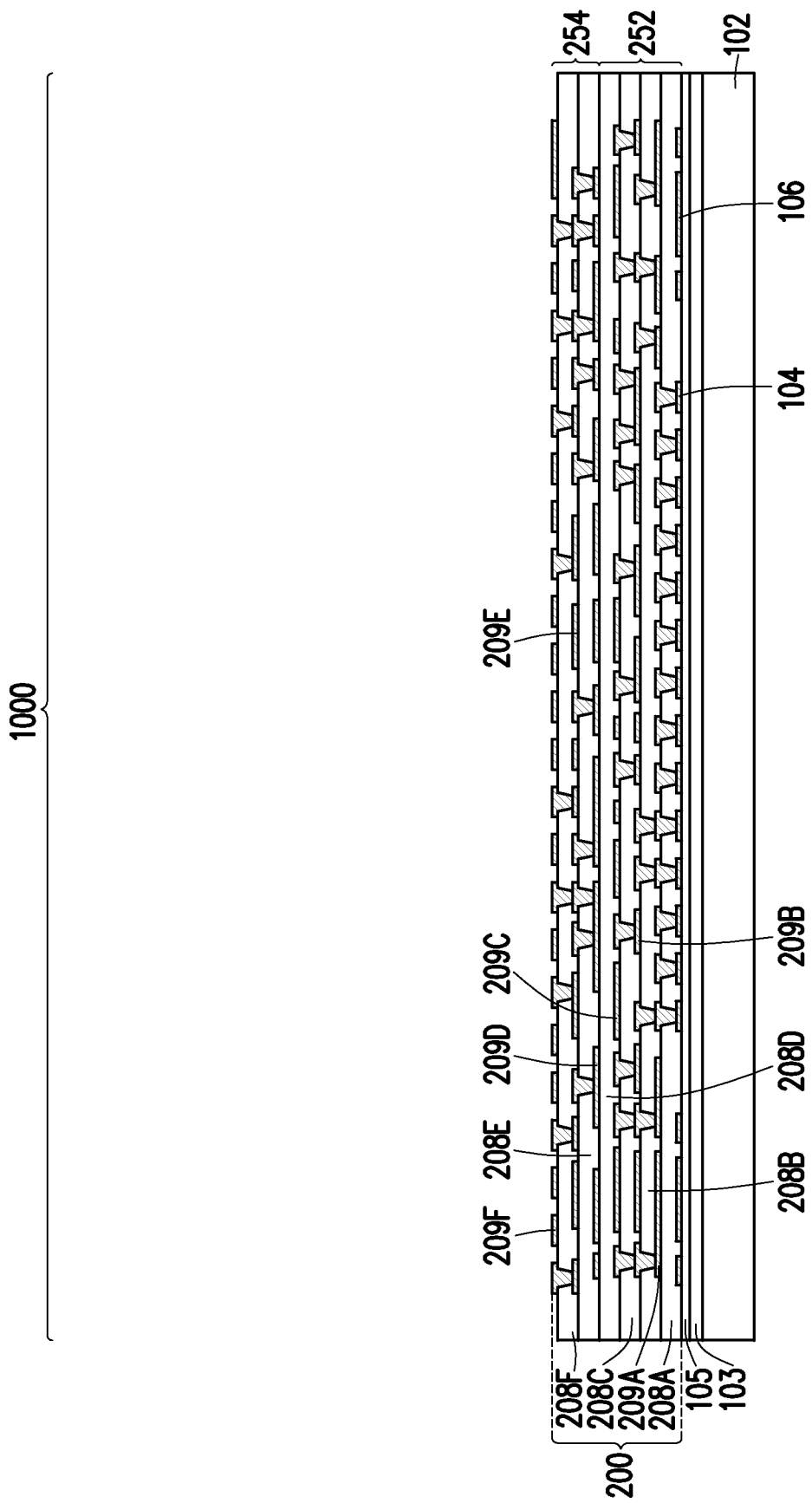

In FIG. 2, an adhesive layer 103 is formed on the carrier substrate 102 to facilitate a subsequent debonding of the carrier substrate 102. The adhesive layer 103 may comprise a polymer-based material, which may be removed along with the carrier substrate 102 from the overlying structures that will be formed in subsequent steps. In some embodiments, the adhesive layer 103 may comprise an epoxy-based thermal-release material, which loses its adhesive property when heated, such as a Light-to-Heat-Conversion (LTHC) release coating. In some embodiments, the adhesive layer 103 may comprise a ultra-violet (UV) glue, which loses its adhesive property when exposed to UV light. In some embodiments, the adhesive layer 103 may comprise pressure sensitive adhesives, radiation curable adhesives, epoxies, combinations of these, or the like. The adhesive layer 103 may be placed onto the carrier substrate 102 in a semi-liquid or gel form, which is readily deformable under pressure. According to some embodiments, the top surface of the adhesive layer 103 may be leveled and may have a high degree of co-planarity.

Next, a polymer layer 105 is formed over the adhesive layer 103. The polymer layer 105 provides protection to subsequently formed structures. In an embodiment, the polymer layer 105 may comprise polybenzoxazole (PBO), a polymide, a polymide derivative, Solder Resistance (SR), Ajinomoto build-up film (ABF), or the like. The polymer layer 105 may be formed using a spin-coating process, or the like, and may have a thickness that is in a range from 2 µm to 15 µm.

Contact pads 104 and contact pads 106 of redistribution structure 200 are then formed over the polymer layer 105. In accordance with some embodiments, the contact pads 104 and the contact pads 106 may be formed by initially forming a first seed layer (not shown) of one or more thin layers of a conductive material that aids in the formation of a thicker layer during subsequent processing steps. The first seed layer may comprise a layer of titanium formed using processes such as sputtering, evaporation, PECVD, or the like. A photoresist (also not shown) may then be formed and patterned to cover the first seed layer using, e.g., a spin coating technique. Once the photoresist has been formed and patterned, a conductive material may be formed on the first seed layer. The conductive material may be a material such as copper, titanium, tungsten, aluminum, another metal, the like, or a combination thereof. The conductive material may be formed through a deposition process such as electroplating, electroless plating, or the like. Once the conductive material has been formed, the photoresist may be removed through a suitable removal process such as ashing or chemical stripping. Additionally, after the removal of the photoresist, those portions of the first seed layer that were covered by the photoresist may be removed through, for example, a suitable wet etch process or dry etch process, which may use the conductive material as an etch mask. The remaining portions of the first seed layer and conductive material form the contact pads 104 and the contact pads 106. In some embodiments, a pitch of the contact pads 104 and the contact pads 106 may be different to allow conductive connectors having different pitches to be formed on the contact pads 104 and the contact pads 106. For example, a pitch of the contact pads 104 may be smaller than a pitch of the contact pads 106. Specifically, conductive connectors 404 formed on the contact pads 104 (described subsequently in FIG. 8) may have a pitch P4 that is in a range from about 50 µm to about 250 µm, and conductive connectors 406 formed on the contact pads 106 (described subsequently in FIG. 8) may have a pitch P5 that is in a range from about 150 µm to about 1000 µm.

Further, in FIG. 2, the remainder of the redistribution structure 200 is formed over the carrier substrate 102, in accordance with some embodiments. The redistribution structure 200 may comprise a first redistribution portion 252 and a second redistribution portion 254. The first redistribution portion 252 may comprise insulating layers 208A-D (e.g., insulating layer 208A, insulating layer 208B, insulating layer 208C, and insulating layer 208D), and redistribution layers 209A-D (e.g., redistribution layer 209A, redistribution layer 209B, redistribution layer 209C, and redistribution layer 209D). The second redistribution portion 254 may comprise insulating layers 208E-F (e.g., insulating layer 208E and insulating layer 208F), and redistribution layers 209E-F (e.g., redistribution layer 209E and redistribution layer 209F). In some embodiments, the redistribution structure 200 may have a number of insulating layers or redistribution layers that is in a range from 1 to 20 layers.

As an example to form the redistribution structure 200, the insulating layer 208A is formed over the contact pads 104, the contact pads 106, and the carrier substrate 102. The insulating layer 208A may comprise one or more dielectric materials such as prepreg, resin coated copper (RCC), an oxide (e.g., silicon oxide), a nitride (e.g., silicon nitride), a photo image dielectric (PID), a polymer material such a PBO, a photosensitive polymer material, a molding material, a polyimide material, a low-k dielectric material, another dielectric material, the like, or a combination thereof. The insulating layer 208A may be formed by a process such as lamination, coating, (e.g., spin-coating), CVD, the like, or a combination thereof.

Openings into the insulating layer 208A may be may be patterned directly using an exposure and development process to expose the underlying contact pads 104 and the contact pads 106 when the insulating layer 208A is formed of a photosensitive polymer such as PBO, polyimide, BCB, or the like. In other embodiments, openings into the insulating layer 208A may be formed using a suitable photolithographic mask and etching process in order to expose the underlying contact pads 104 and the contact pads 106. For example, a photoresist may be formed and patterned over the insulating layer 208A, and one or more etching processes (e.g., a wet etching process or a dry etching process) are utilized to remove portions of the insulating layer 208A.

The redistribution layer 209A may then be formed to provide additional routing. In an embodiment, the redistribution layer 209A may be formed using materials and processes similar to the contact pads 104 and the contact pads 106. For example, a second seed layer (not shown) may be formed, a photoresist placed and patterned on top of the second seed layer in a desired pattern for the redistribution layer 209A, and conductive material (e.g., copper, titanium, or the like) may then be formed in the patterned openings of the photoresist using e.g., a plating process. The photoresist may then be removed and the second seed layer etched, forming redistribution layer 209A. In this manner, the redistribution layer 209A may form electrical connections to the contact pads 104 and the contact pads 106.

Additional insulating layers 209B-D and redistribution layers 209B-D of the first redistribution portion 252 and additional insulating layers 209E-F and redistribution layers 209E-F of the second redistribution portion 254 may then be formed over the redistribution layer 209A and insulating layer 208A to provide additional routing. The insulating layers 209B-F and redistribution layers 209B-F may be formed in alternating layers, and may be formed using processes and materials similar to those used for the insulating layer 208A and the redistribution layer 209A, respectively. The steps described above may be repeated to form the redistribution structure 200 having a suitable number and configuration of insulation layers and redistribution layers. The insulating layers 208A-F may be formed to each have a thickness in a range from 2 µm to 100 µm. The redistribution layers 209A-F may be formed to each have a thickness in a range from 2 µm to 15 µm. In some embodiments, the redistribution structure 200 is a fan-out structure. In other embodiments, the redistribution structure 200 may be formed in a different process than described herein.

In some embodiments, the insulating layer 208E and insulating layer 208F of the second redistribution portion 254 may be formed differently from the underlying insulating layer 208A, insulating layer 208B, insulating layer 208C, and insulating layer 208D of the first redistribution portion 252. For example, in an embodiment the insulating layer 208A, the insulating layer 208B, the insulating layer 208C, and the insulating layer 208D may be formed of a material such as an Ajinomoto build up film or a prepreg material to a larger thickness, and the insulating layer 208E and the insulating layer 208F may be formed from a different material and/or a different thickness, such as by being formed of PBO. However, any combination of materials and thicknesses may be utilized. In some embodiments, the thickness of the insulating layers 208A-D of the first redistribution portion 252 and the thickness of the insulating layers 208E-F of the second redistribution portion 254 are different, and the thickness of the redistribution layers 209A-D of the first redistribution portion 252 and the thickness of the redistribution layers 209E-F of the second redistribution portion 254 are different. As a result, the nominal impedance of the redistribution layers 209A-D of the first redistribution portion 252 and the nominal impedance of the redistribution layers 209E-F of the second redistribution portion 254 is different.

Figure 3:
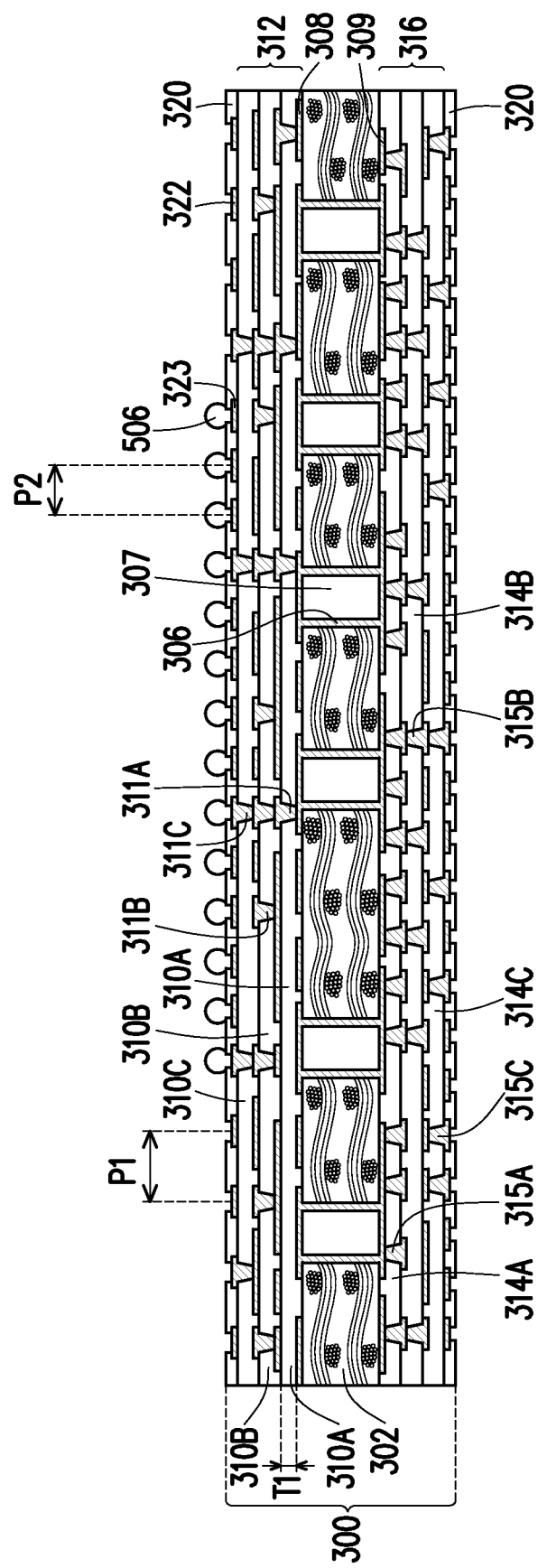

In FIG. 3, an interconnect structure 300 is shown, in accordance with some embodiments. The interconnect structure 300 is subsequently bonded to the redistribution structure 200 (shown in FIG. 4). The interconnect structure 300 is formed in a separate process, and can be tested separately so that a known good interconnect structure 300 is used. For example, in some embodiments, the interconnect structure 300 may be individually or batch tested, validated, and/or verified prior to bonding the interconnect structure 300 to the redistribution structure 200 (shown subsequently in FIG. 4). In some embodiments, the interconnect structure 300 may be an interposer or a "semi-finished substrate" which could either have active and passive devices or else may be free from active and passive devices. The interconnect structure 300 may provide stability and rigidity to the subsequently attached redistribution structure 200 (shown in FIG. 4), helping to reduce warping. In some embodiments, the interconnect structure 300 may comprise a core substrate 302 having conductive layers disposed on opposite surfaces. The core substrate 302 may be formed of organic and/or inorganic materials and may comprise a pre-impregnated composite fiber (prepreg) material, an epoxy, a molding compound, Ajinomoto build-up film (ABF), an epoxy molding compound, fiberglass-reinforced resin materials, printed circuit board (PCB) materials, silica filler, polymer materials, polyimide materials, paper, glass fiber, non-woven glass fabric, glass, ceramic, other laminates, the like, or combinations thereof. In some embodiments, the core substrate 302 may comprises between 2 and 10 complete layers of material. In other embodiments, the core substrate 302 may comprise a double-sided copper-clad laminate (CCL) substrate or the like.

During the formation of the interconnect structure 300, openings are formed in the core substrate 302 within which through vias 306 are formed (described below). In some embodiments, the openings may be formed by a laser drilling technique, mechanical drilling, etching, or the like. Once the openings have been formed, conductive material is deposited to form the routing layer 308 on a side of the core substrate 302 and through vias 306 within the openings in the core substrate 302. In some embodiments, the routing layer 308 and through vias 306 may comprise a conductive material such as copper, aluminum, combinations of these, or the like, and are formed using a deposition process such as photoresist patterning and plating, blanket chemical vapor deposition, atomic layer deposition, physical vapor deposition, combinations of these, or the like. The deposition process lines or fills the openings to form the through vias 306, as well as forming the routing layer 308. Once the conductive material has been deposited, the conductive material may be patterned (in embodiments in which a blanket deposition was performed) or else the patterned photoresist may be removed (in embodiments in which a plating process is utilized). However, any suitable deposition and/or patterning process may be utilized.

Once the routing layer 308 has been formed, a similar process may then be performed on the opposite side of the core substrate 302 to form the routing layer 309 (and/or remaining portions of through vias 306) on the opposite side of the core substrate 302. In this manner, the conductive material may be used to form the routing layer 308 and the routing layer 309 on opposite sides of the core substrate 302 and through vias 306 extending through the core substrate 302.

Optionally, in some embodiments in which the deposition of the conductive material does not fully fill the openings, a remainder of the openings may be filled with a dielectric material 307. The dielectric material 307 may provide structural support and protection for the conductive material formed along the sidewalls of the openings. In some embodiments, the dielectric material 307 may comprise a molding material, epoxy, an epoxy molding compound, a resin, the like, or a combination thereof. The dielectric material 307 may be formed or placed using a molding process, a spin-on process, or the like.

Continuing with the formation of the interconnect structure 300, dielectric layers and additional routing layers may be formed over the routing layers 308 and 309 to form routing structures 312 and 316. The routing structures 312 and 316 are formed on opposite sides of the core substrate 302 and may provide additional electrical routing within the interconnect structure 300. The routing structure 312 is electrically connected to the routing layer 308 and includes dielectric layers 310A-C and routing layers 311A-C. The routing structure 316 is electrically connected to the routing layer 309 and includes dielectric layers 314A-C and routing layers 315A-C. Each of the routing structures 312 or 316 may have any suitable number of dielectric layers or routing layers, including more or fewer than shown in FIG. 3. In some embodiments, one or both of routing structures 312 or 316 may be omitted. In some embodiments, the number of layers of routing structure 312 may be different than the number of layers of routing structure 316.

In some embodiments, the routing structure 312 is formed by forming the dielectric layer 310A over the routing layer 308 and the core substrate 302. In some embodiments, the dielectric layer 310A may comprise a build-up material, ABF, a prepreg material, a laminate material, another material similar to those described above for the core substrate 302, the like, or combinations thereof. The dielectric layer 310A may be formed by a lamination process, a coating process, or the like. In some embodiments, the dielectric layer 310A may have a first thickness T1 of between about 5 μm and about 50 μm. Openings are formed in the dielectric layer 310A that expose portions of the routing layer 308 for subsequent electrical connection. In some embodiments, the openings are formed by an etching process, a laser drilling technique, or the like. Other processes, e.g., mechanical drilling or the like, may also be used in other embodiments. In some embodiments, an optional surface preparation process (e.g., a desmear process or the like) may be performed after the openings are formed.

A conductive material is then deposited to form routing layer 311A on the dielectric layer 310A and within the openings in the dielectric layer 310A. In some embodiments, the routing layer 311A is formed by first forming a seed layer and a patterned mask over the dielectric layer 310A. The patterned mask may be, for example, a patterned photoresist layer. Openings in the patterned mask may expose portions of the seed layer on which conductive material will subsequently be formed. The conductive material may then be deposited on the exposed regions of the dielectric layer 310A and within the openings in the dielectric layer 310A using, for example, a plating process, an electroless plating process, or the like. In some embodiments, the conductive material is deposited having a thickness of between about 1 μm and about 50 μm. After depositing the conductive material, the patterned mask layer (e.g., the photoresist) may be removed using a wet chemical process or a dry process (e.g., an ashing process). In this manner, an additional routing layer (e.g., routing layer 311A) is formed over and electrically connected to the routing layer 308.

Additional dielectric layers 310B-C and routing layers 311B-C may then be formed adjacent to the routing layer 311A and dielectric layer 310A to provide additional routing along with electrical connection within the routing structure 312. The dielectric layers 310B-C and routing layers 311B-C may be formed using processes and materials similar to those used for the dielectric layer 310A or the routing layer 311A. These steps may be repeated to form a routing structure 312 having any suitable number and configuration of dielectric layers and routing layers.

In some embodiments, dielectric layers 314A-C and routing layers 315A-C may be formed adjacent to the routing layer 309 to form the routing structure 316. The routing structure 316 may be formed using a process similar to that of the routing structure 312, described above. However, any suitable process may be utilized. In some embodiments, bond pads 322 and bond pads 323 are formed over and electrically connected to the routing layer 311C. Each of the bond pads 322 may comprise a land grid array (LGA) pad, or the like, configured to be mounted on a print circuit board (PCB). To form the bond pads 322 and the bond pads 323, a photoresist (not shown) may be formed over the routing structure 312 and patterned. Next a conductive material may be formed through a deposition process such as electroplating, electroless plating, or the like. The conductive material may comprise a metal (e.g., nickel, gold, the like, or a combination thereof). Once the conductive material has been formed, the photoresist may be removed through a suitable removal process such as ashing or chemical stripping. In some embodiments, the bond pads 322 may have a pitch P1 that is in a range from about 200 μm to about 1000 μm. The bond pads 323 may have a pitch that is different from (e.g., smaller) the bond pads 322 to allow conductive connectors having different pitches to be formed on the bond pads 323. For example, conductive connectors 506 formed on the bond pads 323 (described in detail below) may have a have a pitch P2 that is in a range from about 50 μm to about 250 μm.

A protection layer 320 is then formed over the routing structures 312 and 316 of interconnect structure 300. The protection layer 320 may comprise a solder resist material or a PBO material, and may be formed to protect the surfaces of the routing structures 312 or 316. In some embodiments, the protection layer 320 may be a photosensitive material formed by printing, lamination, spin-coating, or the like. The photosensitive material may then be exposed to an optical pattern and developed, forming openings in the photosensitive material that expose portions of the routing layer 315C, the bond pads 322, and the bond pads 323. In other embodiments, the protection layer 320 may be formed by depositing a non-photosensitive dielectric layer (e.g., silicon oxide, silicon nitride, the like, or a combination), forming a patterned photoresist mask over the dielectric layer using suitable photolithography techniques, and then etching the dielectric layer using the patterned photoresist mask using a suitable etching process (e.g., wet etching or dry etching). The protection layer 320 may be formed and patterned over the routing structure 312 and the routing structure 316 using the same techniques. Other processes and materials may also be used. In some embodiments, the interconnect structure 300 may be formed with one or both of the routing structures 312 and 316. In some embodiments, the interconnect structure 300 may be formed with the protection layer 320 formed and patterned over one or both of the routing structures 312 and 316.

Conductive connectors 506 are then formed on the exposed bond pads 323. The conductive connectors 506 are electrically coupled to the routing structure 312 through the bond pads 323. The conductive connectors 506 may comprise ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 506 may comprise a conductive material such as solder, copper, aluminum, gold, nickel, silver, palladium, tin, the like, or a combination thereof. In some embodiments, the conductive connectors 506 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 506 comprise metal pillars (such as a copper pillar) formed by a sputtering, printing, electro plating, electroless plating, CVD, or the like. The metal pillars may be solder free and have substantially vertical sidewalls. In some embodiments, a metal cap layer is formed on the top of the metal pillars. The metal cap layer may comprise nickel, tin, tin-lead, gold, silver, palladium, indium, nickel-palladium-gold, nickel-gold, the like, or a combination thereof and may be formed by a plating process. In some embodiments, the conductive connectors 506 may have the pitch P2 that is in a range from about 50 μm to about 250 μm. In some embodiments, the bond pads 323 may have a pitch that is different from (e.g., smaller) the bond pads 322.

Figure 4:
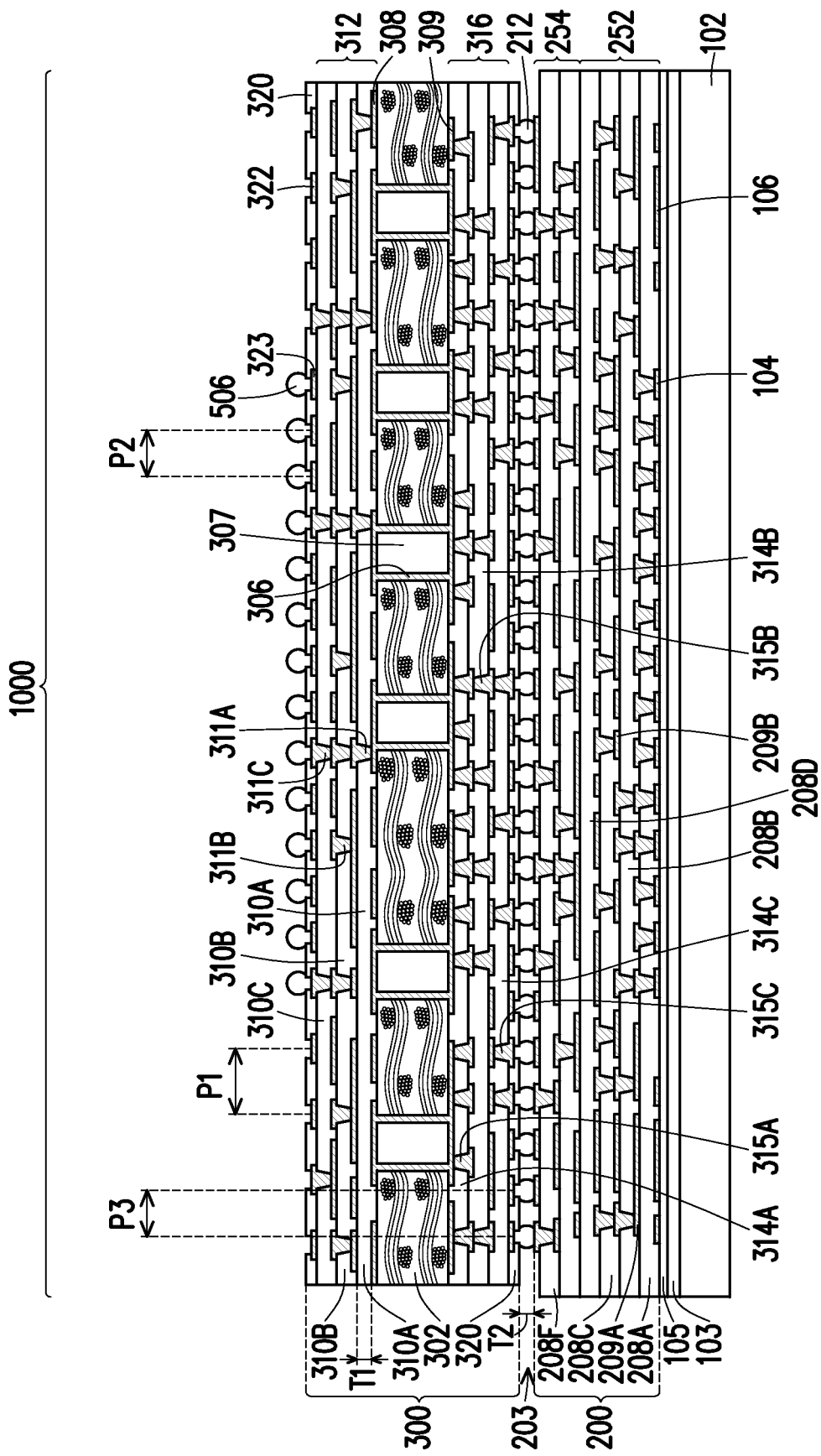

In FIG. 4, the interconnect structure 300 is bonded to the redistribution structure 200. In some embodiments, under-bump metallization structures (UBMs, not shown) are first formed on portions of the topmost redistribution layer of the redistribution structure 200 (e.g., redistribution layer 209F in FIG. 2). The UBMs may comprise three layers of conductive materials, such as a layer of titanium, a layer of copper, and a layer of nickel. However, other arrangements of materials and layers may be used, such as an arrangement of chrome/chrome-copper alloy/copper/gold, an arrangement of titanium/titanium tungsten/copper, or an arrangement of copper/nickel/gold, that are suitable for the formation of the UBMs. Any suitable materials or layers of material that may be used for the UBMs are fully intended to be included within the scope of the current application. The UBMs may be created by forming each layer of the UBMs over the redistribution structure 200. The forming of each layer may be performed using a plating process (e.g., electroplating or electroless plating), sputtering, evaporation, PECVD, or the like. Once the layers of the UBMs have been formed, portions of the layers may then be removed through a suitable photolithographic masking and etching process.

Still referring to FIG. 4, conductive connectors 212 are then formed over the redistribution structure 200. The conductive connectors 212 may be formed over the UBMs, if present. The conductive connectors 212 may comprise ball grid array (BGA) connectors, solder balls, metal pillars, controlled collapse chip connection (C4) bumps, contact bumps, micro bumps, electroless nickel-electroless palladium-immersion gold technique (ENEPIG) formed bumps, or the like. The conductive connectors 212 may comprise a conductive material such as solder, copper, aluminum, gold, nickel, silver, palladium, tin, the like, or a combination thereof. In some embodiments, the conductive connectors 212 are formed by initially forming a layer of solder through evaporation, electroplating, printing, solder transfer, ball placement, or the like. Once a layer of solder has been formed on the structure, a reflow may be performed in order to shape the material into the desired bump shapes. In some embodiments, the conductive connectors 212 comprise metal pillars (such as a copper pillar) formed by a sputtering, printing, electro plating, electroless plating, CVD, or the like. The metal pillars may be solder free and have substantially vertical sidewalls. In some embodiments, the conductive connectors 212 may have a pitch P3 that is in a range from about 100 μm to about 1000 μm.

Next, a mounting process is performed to place the interconnect structure 300 into electrical connection with the redistribution structure 200, in accordance with some embodiments. In an embodiment, the interconnect structure 300 is placed into physical contact with the conductive connectors 212 on the redistribution structure 200 using, e.g., a pick and place process. The interconnect structure 300 may be placed such that exposed regions of a topmost routing layer (e.g., routing layers 315C) are aligned with corresponding connectors of the conductive connectors 212 on the redistribution structure 200. Once in physical contact, a reflow process may be utilized to bond the conductive connectors 212 of the redistribution structure 200 to the interconnect structure 300. In some embodiments, conductive connectors are formed on the interconnect structure 300 instead of or in addition to the conductive connectors 212 formed on the redistribution structure 200. After the interconnect structure 300 is bonded to the redistribution structure 200, a first gap 203 is formed between the protection layer 320 of the interconnect structure 300 and the top insulating layer (e.g., insulating layer 208F) of the redistribution structure 200. According to some embodiments, a height T2 of the first gap 203 may be in a range from about 20 μm to about 500 μm.

Figure 5:
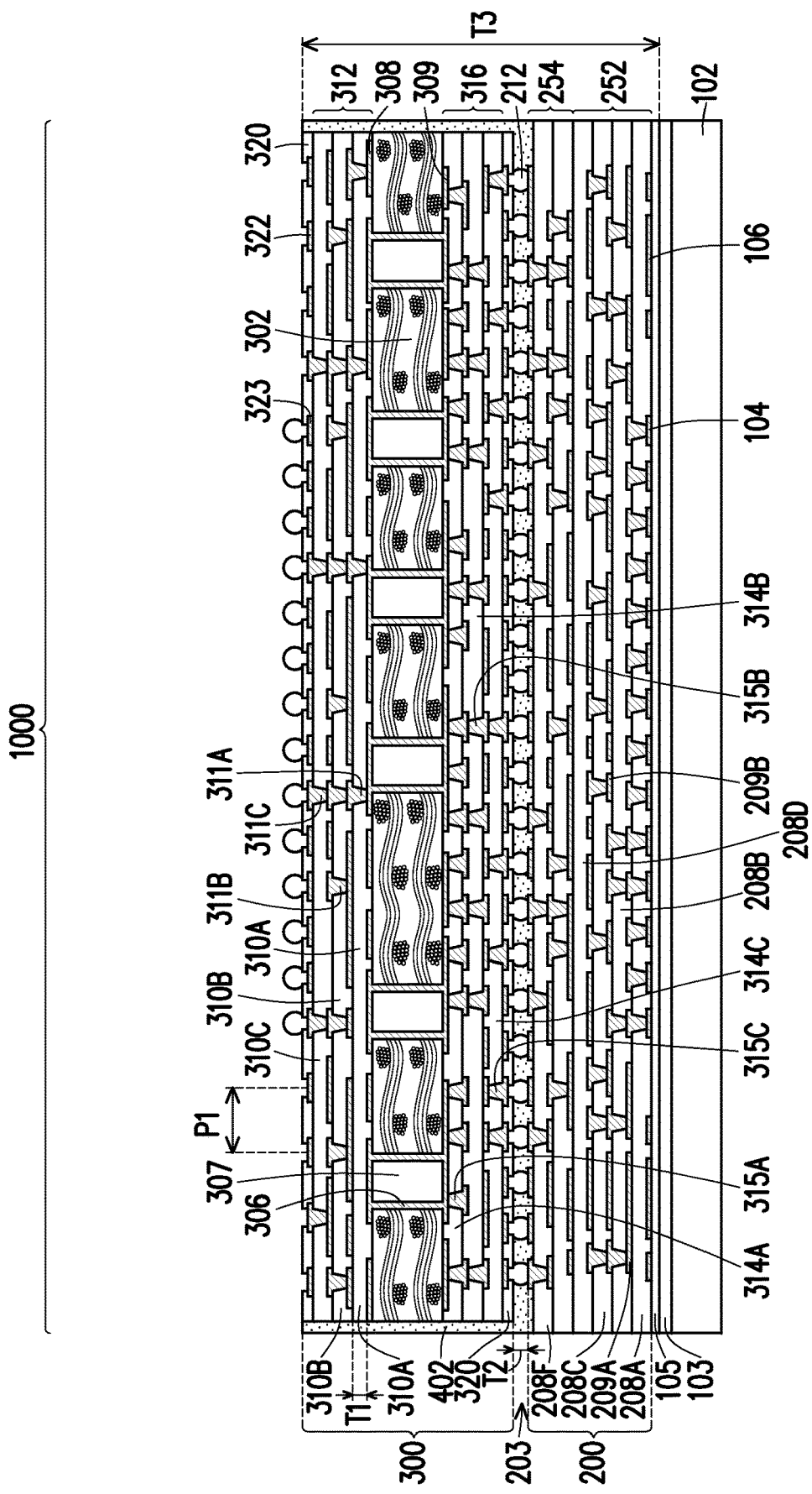
Figure 6A:
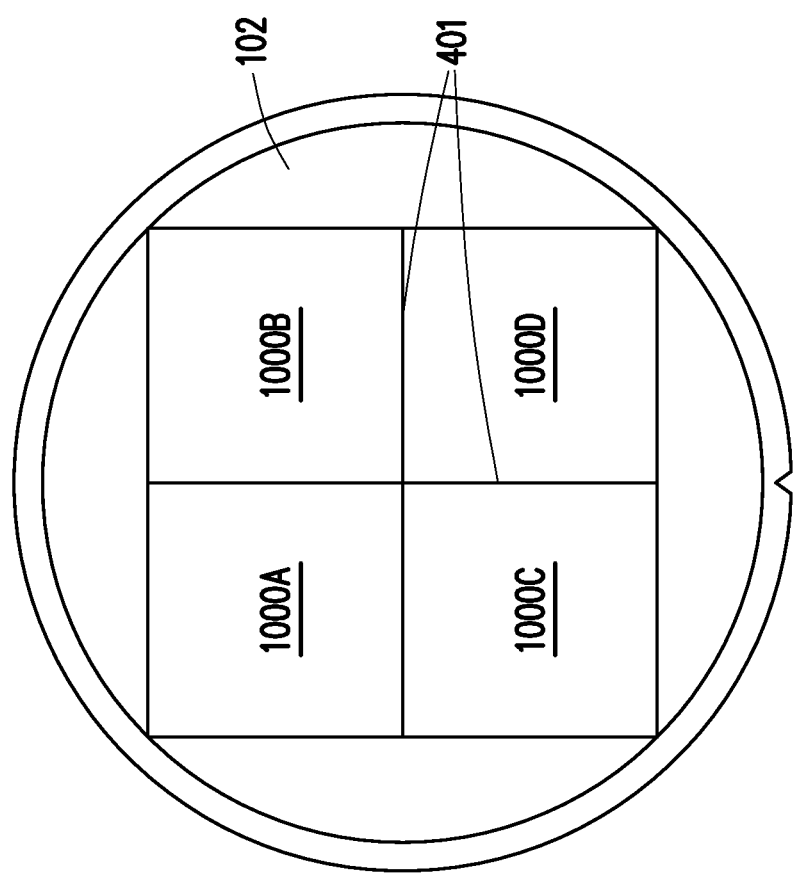
FIG. 6A illustrates a top view of the layout of package regions on a wafer substrate in accordance with some embodiments.
Figure 6B:
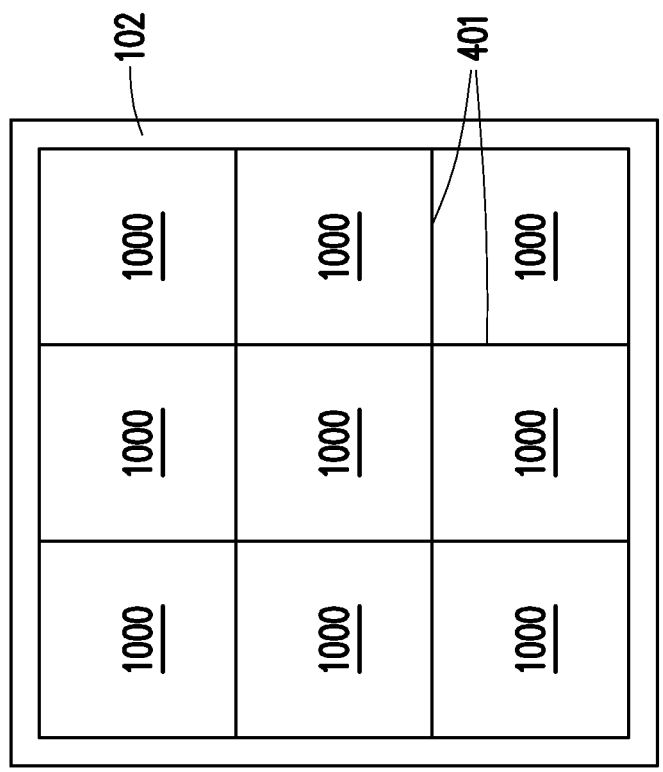
FIG. 6B illustrates a top view of the layout of package regions on a panel substrate in accordance with some embodiments.

In FIG. 5, a molding process is performed to encapsulate the interconnect structure 300 attached to the redistribution structure 200. The molding process comprises depositing an underfill 402 to fill the first gap 203 in between the protection layer 320 of the interconnect structure 300 and the top insulating layer (e.g., insulating layer 208F) of the redistribution structure 200. According to some embodiments, the underfill 402 fills the voids within the first gap 203 in between conductive connectors 212 connecting the redistribution structure 200 and the interconnect structure 300 and forms along sidewalls of the interconnect structure 300 to align with an outer perimeter of the redistribution structure 200. According to some embodiments, a thickness T3 from a top surface of the protection layer 320 over the routing structures 312 to a bottom surface of the polymer layer 105 may be in a range from about 150 μm to about 5000 μm.

According to some embodiments, the underfill 402 may comprise a molding compound, an epoxy, an underfill, a dispense molding underfill (DMUF), a resin, or the like. The underfill 402 may be dispensed using, e.g., a molding process, such as a transfer molding process, an injection process, combinations of these, or the like. The underfill 402 may protect the conductive connectors 212 and provide structural support for the redistribution structure 200. In some embodiments, after dispensing the underfill 402 a curing process may be performed.

In FIG. 6A, a top-down view of the carrier substrate 102 is shown after the mounting of a plurality of interconnect structures 300 on the redistribution structure 200 using a wafer form process, in accordance with some embodiments. The carrier substrate 102 may have a round or circular shape and may be referred to herein as a wafer carrier substrate. The redistribution structure 200 may be larger and include a plurality of first package regions 1000. For example, FIG. 6A illustrates the redistribution structure 200 having a circular wafer shape with four first package regions 1000A, 1000B, 1000C, and 1000D included on the carrier substrate 102 allowing for four final package components to be fabricated on a single wafer and later singulated by sawing along lines 401 and around the outer edges of first package regions 1000A, 1000B, 1000C, and 1000D. As illustrated in FIG. 6A, the first package regions 1000 may have rectangular shapes and may be formed on the carrier substrate 102 having a round shape, such as a circular shape. Although four of the first package regions 1000 are illustrated in FIG. 6A, any number of the first package regions 1000 may be formed on the carrier substrate 102.

In FIG. 6B, a top-down view of the carrier substrate 102 is shown after the mounting of a plurality of interconnect structures 300 on the redistribution structure 200 using a panel form process, in accordance with an alternate embodiment. The carrier substrate 102 may have a rectangular shape, and the carrier substrate 102 may be referred to as a panel. The redistribution structure 200 may be larger and include a plurality of first package regions 1000. For example, FIG. 6B illustrates the redistribution structure 200 having a rectangular shape with nine first package regions 1000 included on the carrier substrate 102 allowing for nine final package components to be fabricated on a single panel and later singulated by sawing along lines 401 and around the outer edges of the first package regions 1000. Although nine of the first package regions 1000 are illustrated in FIG. 6B, any number of the first package regions 1000 may be formed on the carrier substrate 102.

Figure 7A:
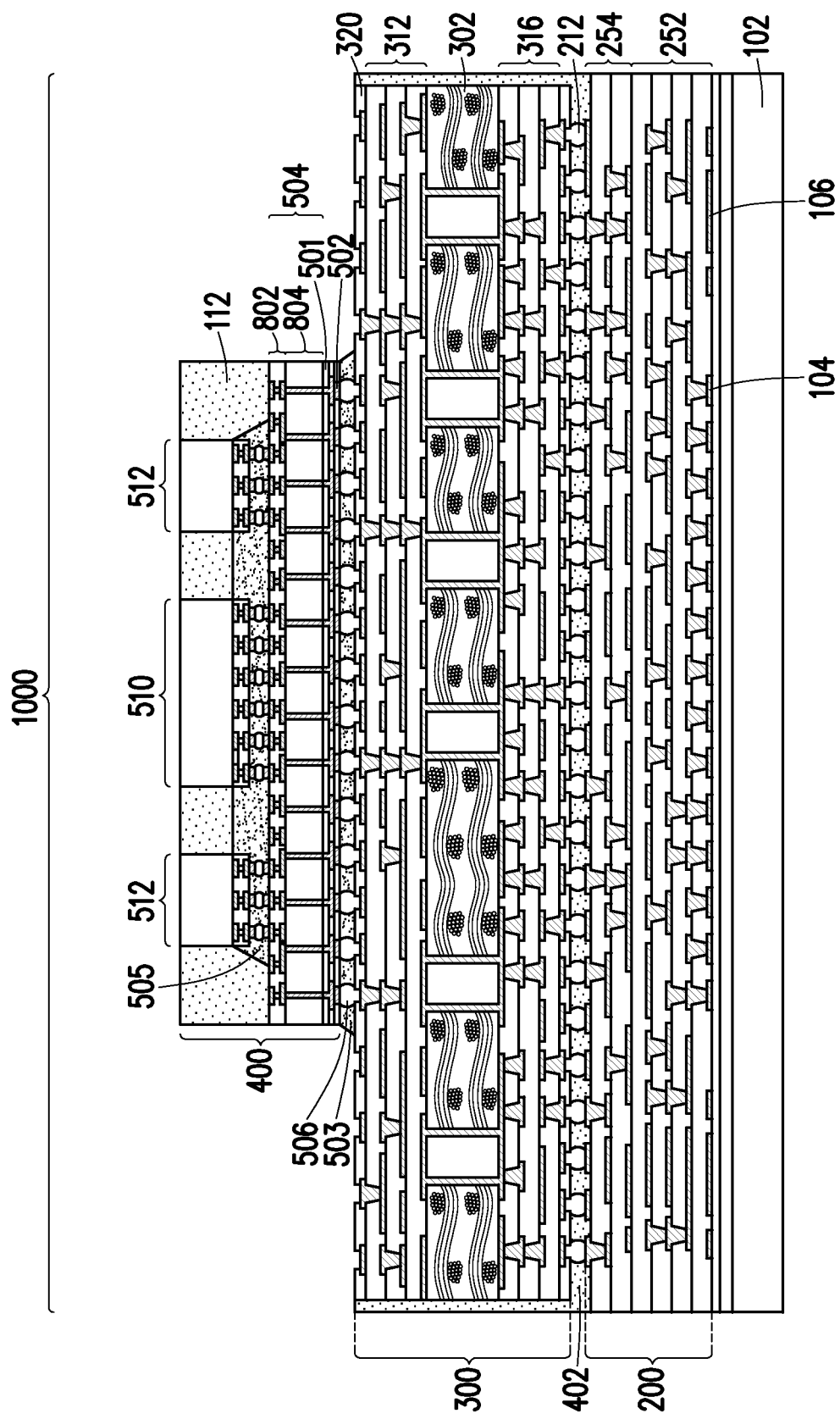
FIGS. 7A-10 illustrate cross-sectional views of intermediate steps of forming a device package, in accordance with some embodiments.

In FIG. 7A, a packaged semiconductor device 400 is placed on the conductive connectors 506 of the interconnect structure 300, making electrical connection between the packaged semiconductor device 400 and the routing structure 312 of the interconnect structure 300. The packaged semiconductor device 400 may be placed on the conductive connectors 506 using a placement process such as a pick-and-place process, or the like. The packaged semiconductor device 400 may include one or more devices, which may include devices designed for an intended purpose such as a memory die (e.g., a DRAM die, a stacked memory die, a high-bandwidth memory (HBM) die, etc.), a logic die, a central processing unit (CPU) die, an I/O die, a system-on-a-chip (SoC), a component on a wafer (CoW), an integrated fan-out structure (InFO), a package, the like, or a combination thereof. In an embodiment, the packaged semiconductor device 400 includes integrated circuit devices, such as transistors, capacitors, inductors, resistors, metallization layers, conductive connectors, and the like, therein, as desired for a particular functionality. In some embodiments, the packaged semiconductor device 400 may include more than one of the same type of device, or may include different devices. FIG. 7A shows three semiconductor devices encapsulated and connected with redistribution structures and contact pads, but in other embodiments one, two, or more than three semiconductor devices may be attached to the conductive connectors 506.

The packaged semiconductor device 400 shown in FIG. 7A may comprise a plurality of the integrated circuit devices 510 and 512 that are attached to the interposer 504. The interposer 504 may include a substrate 804 and the interconnect structure 802. The integrated circuit devices 510 and 512 may each have a single function (e.g., a logic device, memory die, etc.), or may have multiple functions (e.g., a SoC). In an embodiment, the integrated circuit device 510 may comprise a SoC device, and the integrated circuit devices 512 may comprise I/O dies. The packaged semiconductor device 400 may comprise an underfill material 505 dispensed between the integrated circuit devices 510 and 512 and the interconnect structure 802. In some embodiments, the packaged semiconductor device 400 may comprise an encapsulant 112 that surrounds the integrated circuit devices 510 and 512.

Figure 7B:
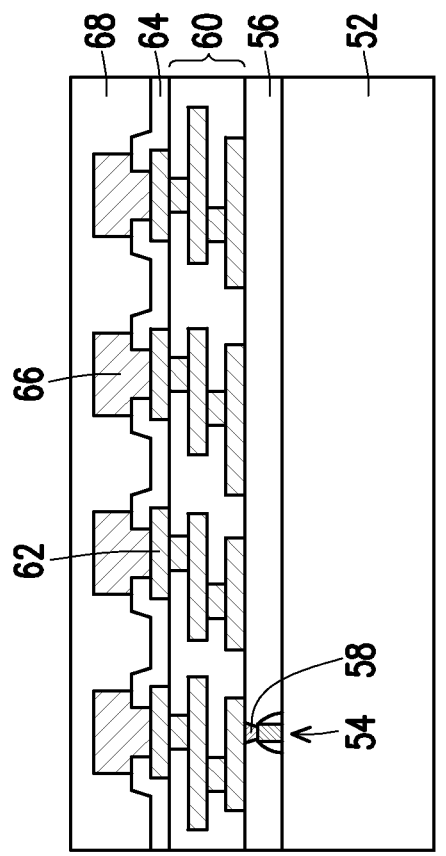

FIG. 7B illustrates a cross-sectional view of the integrated circuit device 510/512 in accordance with some embodiments. The integrated circuit device 510/512 may be formed in a wafer, which may include different device regions that are singulated in subsequent steps to form a plurality of integrated circuit dies. The integrated circuit device 510/512 may be processed according to applicable manufacturing processes to form integrated circuits. For example, the integrated circuit device 510/512 includes a semiconductor substrate 52, such as silicon, doped or undoped, or an active layer of a semiconductor-on-insulator (SOI) substrate. The semiconductor substrate 52 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The semiconductor substrate 52 has an active surface (e.g., the surface facing upwards in FIG. 7B), sometimes called a front side, and an inactive surface (e.g., the surface facing downwards in FIG. 7B), sometimes called a back side.

Devices (represented by a transistor) 54 may be formed at the front surface of the semiconductor substrate 52. The devices 54 may be active devices (e.g., transistors, diodes, etc.), capacitors, resistors, etc. An inter-layer dielectric (ILD) 56 is over the front surface of the semiconductor substrate 52. The ILD 56 surrounds and may cover the devices 54. The ILD 56 may include one or more dielectric layers formed of materials such as Phospho-Silicate Glass (PSG), Boro-Silicate Glass (BSG), Boron-Doped Phospho-Silicate Glass (BPSG), undoped Silicate Glass (USG), or the like.

Conductive plugs 58 extend through the ILD 56 to electrically and physically couple the devices 54. For example, when the devices 54 are transistors, the conductive plugs 58 may couple the gates and source/drain regions of the transistors. The conductive plugs 58 may be formed of tungsten, cobalt, nickel, copper, silver, gold, aluminum, the like, or combinations thereof. An interconnect structure 60 is over the ILD 56 and conductive plugs 58. The interconnect structure 60 interconnects the devices 54 to form an integrated circuit. The interconnect structure 60 may be formed by, for example, metallization patterns in dielectric layers on the ILD 56. The metallization patterns include metal lines and vias formed in one or more low-k dielectric layers. The metallization patterns of the interconnect structure 60 are electrically coupled to the devices 54 by the conductive plugs 58.

The integrated circuit device 510/512 further includes pads 62, such as aluminum pads, to which external connections are made. The pads 62 are on the active side of the integrated circuit device 510/512, such as in and/or on the interconnect structure 60. One or more passivation films 64 are on the integrated circuit device 510/512, such as on portions of the interconnect structure 60 and pads 62. Openings extend through the passivation films 64 to the pads 62. Die connectors 66, such as conductive pillars (for example, formed of a metal such as copper), extend through the openings in the passivation films 64 and are physically and electrically coupled to respective ones of the pads 62. The die connectors 66 may be formed by, for example, plating, or the like. The die connectors 66 electrically couple the respective integrated circuits of the integrated circuit device 510/512.

The packaged semiconductor device 400 may be placed such that conductive bumps 502 are aligned with the conductive connectors 506 of the interconnect structure 300. Once in physical contact, a reflow process may be utilized to bond the conductive connectors 506 of the interconnect structure 300 to the packaged semiconductor device 400. In some embodiments, conductive connectors are formed on the packaged semiconductor device 400 instead of or in addition to the conductive connectors 506 formed on the interconnect structure 300. An underfill 503 may then be formed between the packaged semiconductor device 400 and the interconnect structure 300, surrounding the conductive connectors 506. In some embodiments, the conductive connectors 506 are not formed on the interconnect structure 300, and the packaged semiconductor device 400 is bonded to the interconnect structure 300 using a direct bonding technique such as thermocompression bonding, hybrid bonding, metal-to-metal bonding, or the like. However, any suitable bonding technique may be utilized.

Figure 8:
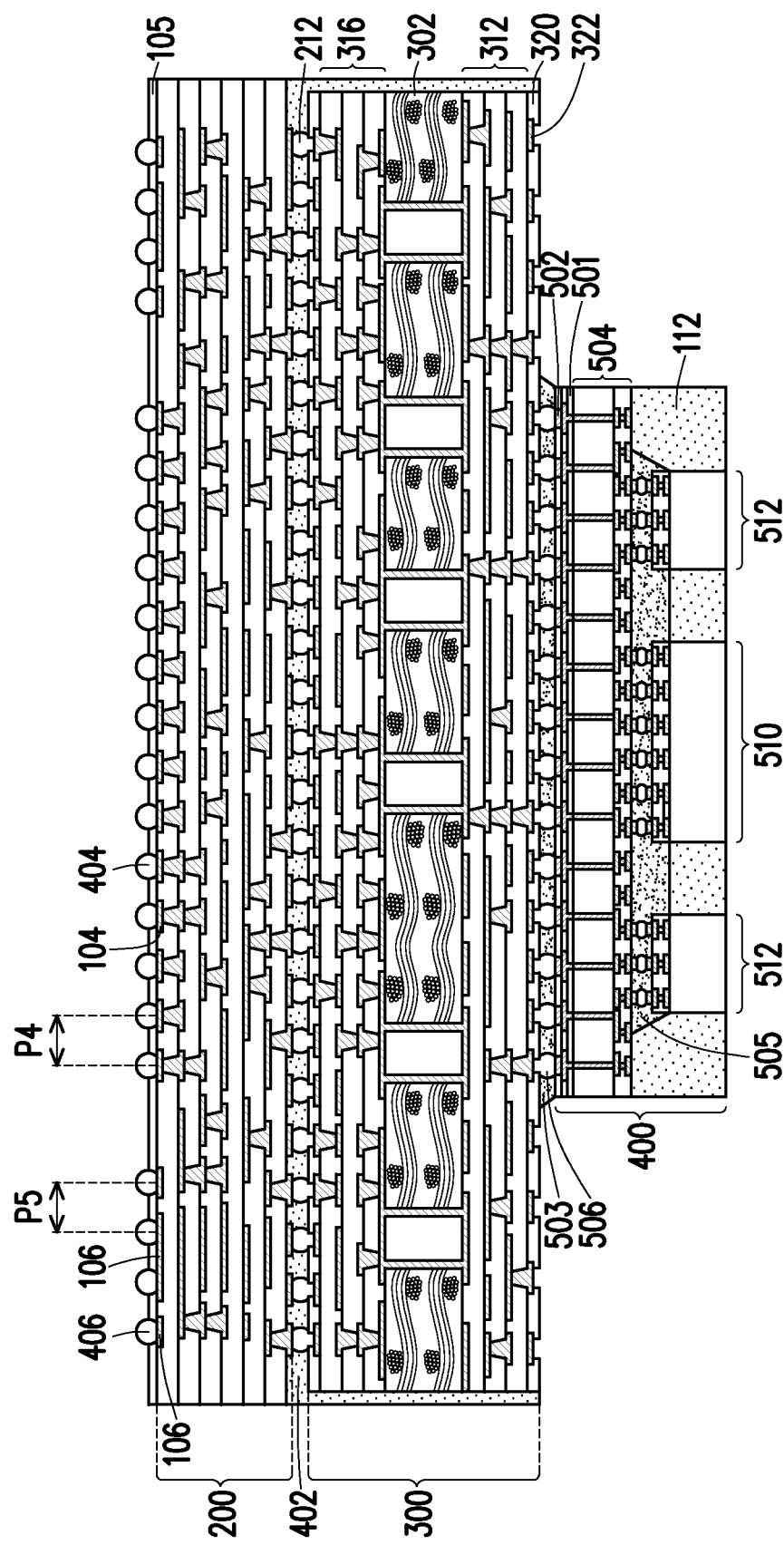

In FIG. 8, a debonding process of the carrier substrate 102 and formation of conductive connectors 404 on the contact pads 104, and the formation of conductive connectors 406 on the contact pads 106 of the redistribution structure 200 is shown. The carrier substrate 102 may be debonded from the redistribution structure 200 using, e.g., a thermal process to alter the adhesive properties of the adhesive layer 103 disposed on the carrier substrate 102. In a particular embodiment an energy source such as an ultraviolet (UV) laser, a carbon dioxide (CO2) laser, or an infrared (IR) laser, is utilized to irradiate and heat the adhesive layer 103 until the adhesive layer 103 loses at least some of its adhesive properties. Once performed, the carrier substrate 102 and the adhesive layer 103 may be physically separated and removed from the redistribution structure 200. Once the carrier substrate 102 and the adhesive layer 103 have been removed, the resulting structure may be flipped over and attached to a temporary substrate (not shown), such as a tape, wafer, panel, frame, ring, or the like for further processing.

FIG. 8 additionally illustrates a patterning of the polymer layer 105 in order to expose the contact pads 104 and the contact pads 106. In an embodiment, the polymer layer 105 may be patterned using, e.g., a laser drilling method. In such a method a protective layer, such as a light-to-heat conversion (LTHC) layer or a hogomax layer (not separately illustrated in FIG. 8) is first deposited over the polymer layer 105. Once protected, a laser is directed towards those portions of the polymer layer 105 which are desired to be removed in order to expose the underlying contact pads 104 and the contact pads 106.

In another embodiment, the polymer layer 105 may be patterned by initially applying a photoresist (not individually illustrated in FIG. 8) to the polymer layer 105 and then exposing the photoresist to a patterned energy source (e.g., a patterned light source) so as to induce a chemical reaction, thereby inducing a physical change in those portions of the photoresist exposed to the patterned light source. A developer is then applied to the exposed photoresist to take advantage of the physical changes and selectively remove either the exposed portion of the photoresist or the unexposed portion of the photoresist, depending upon the desired pattern, and the underlying exposed portion of the polymer layer 105 are removed with, e.g., a dry etch process. However, any other suitable method for patterning the polymer layer 105 may be utilized.

Once the contact pads 104 and the contact pads 106 have been exposed, the conductive connectors 404 may be formed over the contact pads 104, and the conductive connectors 406 may be formed over the contact pads 106 making electrical connection to the redistribution structure 200. In some embodiments, an optional solderability treatment (e.g., pre-soldering treatment) may be performed on the exposed surfaces of the contact pads 104 and the contact pads 106 prior to forming the conductive connectors 404 and 406. The conductive connectors 404 and the conductive connectors 406 may comprise ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 404 and 406 may comprise a conductive material such as solder, copper, aluminum, gold, nickel, silver, palladium, tin, the like, or a combination thereof. In some embodiments, the conductive connectors 404 and 406 are formed by initially forming a layer of solder through evaporation, electroplating, printing, solder transfer, ball placement, or the like. Once a layer of solder has been formed on the structure, a reflow may be performed in order to shape the material into the desired bump shapes. In some embodiments, the conductive connectors 404 may be similar to conductive connectors 506 (described previously in FIG. 3). In some embodiments, the conductive connectors 404 formed on the contact pads 104 and the conductive connectors 406 formed on the contact pads 106 may be different. For example, in an embodiment, the conductive connectors 404 formed on the contact pads 104 may comprise controlled collapse chip connection (C4) bumps and the conductive connectors 406 formed on the contact pads 106 may comprise ball grid array (BGA) connectors. In some embodiments, the conductive connectors 404 may have a pitch P4 that is in a range from about 50 µm to about 250 µm. In some embodiments, the conductive connectors 406 may have a pitch P5 that is in a range from about 150 µm to about 1000 µm. In some embodiments, the pitch P4 of the conductive connectors 404 may be the same or different from the pitch P2 of the conductive connectors 506 formed on the bond pads 323 (described above in FIG. 3).

After the formation of the conductive connectors 404 and the conductive connectors 406, a singulation process may be performed by sawing along scribe line regions, for example, between the first package regions 1000 by sawing along lines 401 and around the outer edges of first package regions 1000A, 1000B, 1000C, and 1000D as shown above in FIG. 6A, or between the first package regions 1000 by sawing along lines 401 and around the outer edges of the first package regions 1000 as shown above in FIG. 6B. The sawing singulates each first package region 1000 from adjacent first package regions 1000 to form multiple singulated package components.

Figure 9:
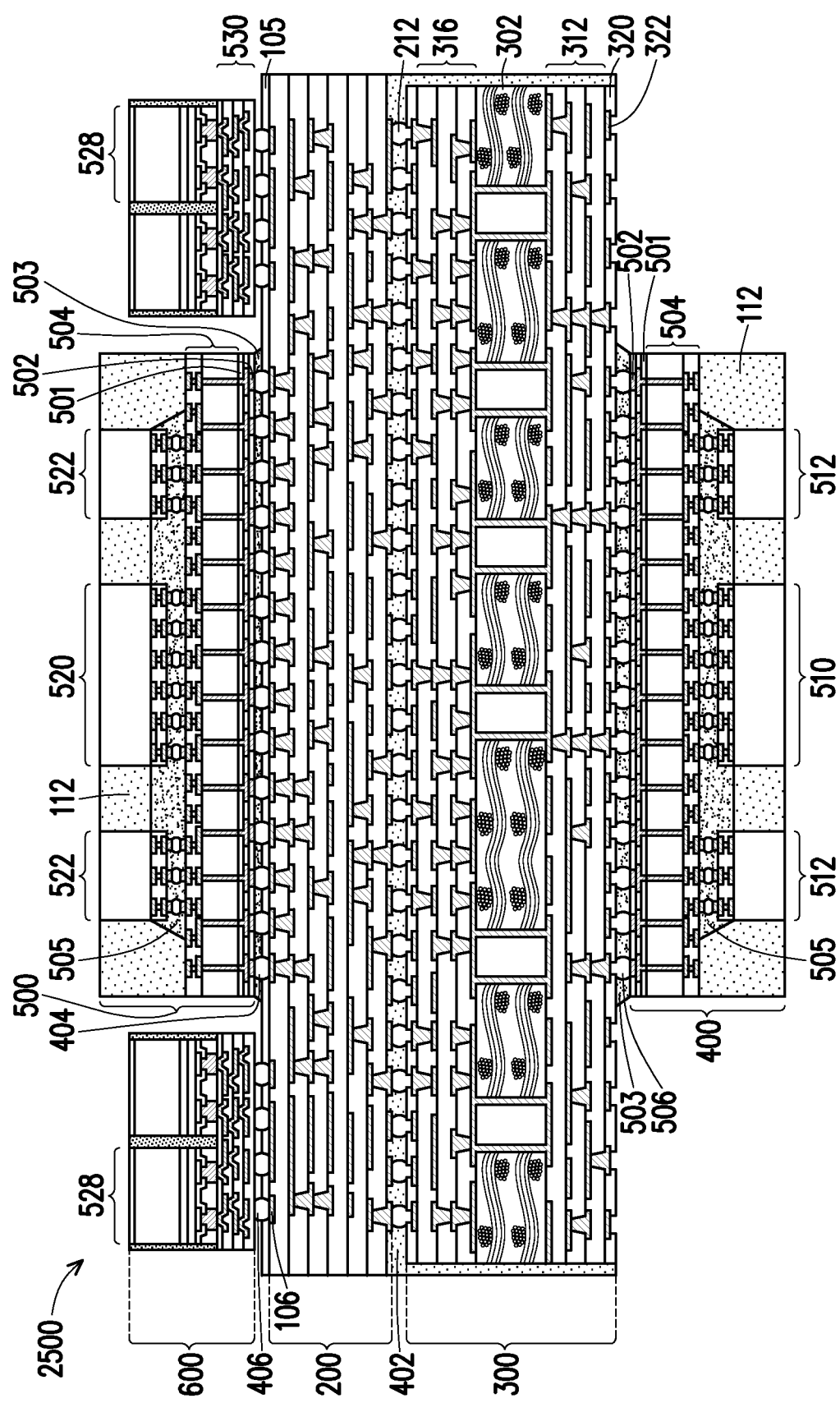

FIG. 9 illustrates a cross-sectional view of intermediate steps in the forming of the device package 2500. In FIG. 9, a packaged semiconductor device 500 is placed on the conductive connectors 404 of the redistribution structure 200, making electrical connection between the packaged semiconductor device 500 and the contact pads 104 of the redistribution structure 200. Unless specified otherwise, like reference numerals in the packaged semiconductor device 500 represent like components in the packaged semiconductor device 400 (described previously in FIGS. 7A and 7B). Accordingly, the process steps and applicable materials may not be repeated herein. The packaged semiconductor device 500 may be placed on the conductive connectors 404 using a placement process such as a pick-and-place process, or the like. The packaged semiconductor device 500 may include one or more devices, which may include devices designed for an intended purpose such as a memory die (e.g., a DRAM die, a stacked memory die, a high-bandwidth memory (HBM) die, etc.), a logic die, a central processing unit (CPU) die, an I/O die, a system-on-a-chip (SoC), a component on a wafer (CoW), an integrated fan-out structure (InFO), a package, the like, or a combination thereof. In an embodiment, the packaged semiconductor device 500 includes integrated circuit devices, such as transistors, capacitors, inductors, resistors, metallization layers, conductive connectors, and the like, therein, as desired for a particular functionality. In some embodiments, the packaged semiconductor device 500 may include more than one of the same type of device, or may include different devices. FIG. 9 shows three semiconductor devices encapsulated and connected with redistribution structures and contact pads, but in other embodiments one, two, or more than three semiconductor devices may be attached to the conductive connectors 404.

The packaged semiconductor device 500 shown in FIG. 9 may comprise a plurality of the integrated circuit devices 520 and 522. The integrated circuit devices 520 and 522 may each have a single function (e.g., a logic device, memory die, etc.), or may have multiple functions (e.g., a SoC). In an embodiment, the integrated circuit device 520 may be similar or different to the integrated circuit device 510. In an embodiment the integrated circuit devices 522 maybe similar or different to the integrated circuit devices 512. In an embodiment, the integrated circuit device 520 may comprise a CPU device, and the integrated circuit devices 512 may comprise HBM dies.

Still referring to FIG. 9, one or more packaged semiconductor devices 600 is placed on the conductive connectors 406 of the redistribution structure 200, making electrical connection between the packaged semiconductor devices 600 and the contact pads 106 of the redistribution structure 200. The packaged semiconductor devices 600 may also be referred to as integrated fan-out (InFO) packages. Each of the packaged semiconductor devices 600 may comprise one or more integrated circuit dies 528 that are electrically connected to the redistribution structure 200 through the front-side redistribution structure 530. The front-side redistribution structure 530 includes any number of dielectric layers and any number of metallization patterns. The metallization patterns may also be referred to as redistribution layers or redistribution lines. Each integrated circuit die 528 may be a logic die (e.g., central processing unit (CPU), graphics processing unit (GPU), system-on-a-chip (SoC), application processor (AP), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies), the like, or combinations thereof. The packaged semiconductor devices 600 may be placed on the conductive connectors 406 using a placement process such as a pick-and-place process, or the like. Once in physical contact, a reflow process may be utilized to bond the conductive connectors 406 of the redistribution structure 200 to the packaged semiconductor devices 600.

Advantages can be achieved as a result of the formation of the device package 2500 in which component devices (e.g., packaged semiconductor device 400, packaged semiconductor device 500, packaged semiconductor device 600, or the like) are bonded on opposite sides of the core substrate 302 to form a system on integrated substrate (SoIS). The core substrate 302 includes an organic substrate, and the core substrate 302 may be part of the pre-fabricated interconnect structure 300 that comprises pre-soldered conductive connectors 404. These advantages may include the ability to electrically connect and integrate a higher number of component devices (e.g., packaged semiconductor device 400, packaged semiconductor device 500, packaged semiconductor device 600 . . . ) within the device package 2500. In addition, because of the compact structure of the device package 2500, the package components (e.g., packaged semiconductor device 400, packaged semiconductor device 500, packaged semiconductor device 600, or the like) are closer to each other which results in better power and signal integrity with reduced transmission losses. Accordingly, this leads to better computing performance and allows the use of the device package in applications that require faster processing of data and performing of complex calculations at high speeds (e.g., High-Performance-Computing (HPC)).

Figure 10:
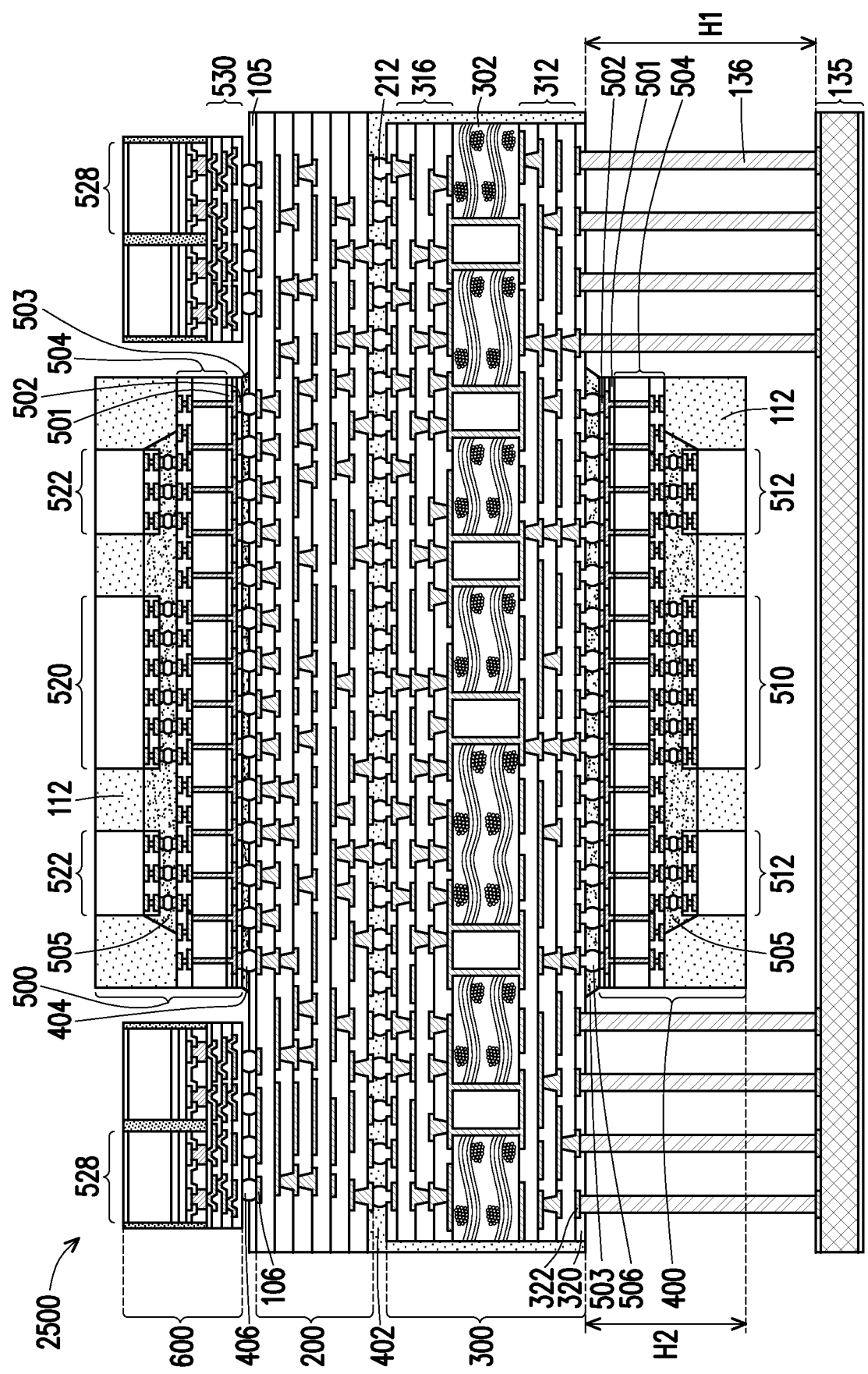

FIG. 10 illustrates a cross-sectional view of the device package 2500 in accordance with some embodiments. In FIG. 10, the structure shown in FIG. 9 is mounted on to a support substrate 135 (e.g., a printed circuit board (PCB)).

The support substrate 135 may be a printed circuit board such as a laminate substrate formed as a stack of multiple thin layers (or laminates) of a polymer material such as bismaleimide triazine (BT), FR-4, ABF, or the like. However, any other suitable substrate, such as a silicon interposer, a silicon substrate, organic substrate, a ceramic substrate, or the like, may also be utilized. Conductive connectors 136 may be used to bond the support substrate 135 to the bond pads 322 of the interconnect structure 300 as illustrated in FIG. 10. The conductive connectors 136 may comprise metal pins that can be connected to socket connectors on the support substrate 135. The metal pins may be formed using an electroless nickel-electroless palladium-immersion gold technique (ENEPIG), or the like. The conductive connectors 136 may have a height H1 that is larger than a height H2 of the packaged semiconductor device 400 to allow the packaged semiconductor device 400 to be disposed between the support substrate 135 and the interconnect structure 300. In other embodiments, the conductive connectors 136 may be electroless nickel-electroless palladium-immersion gold technique (ENEPIG) formed bumps, or the like.

In other embodiments, the conductive connectors 136 may include a conductive material such as solder, copper, copper pin, alloy pin, aluminum, gold, nickel, silver, palladium, tin, the like, or a combination thereof. The conductive connectors 136 may be first formed on either the support substrate 135, or the interconnect structure 300, and then reflowed to complete the bond. In such an embodiment, the height H1 of the conductive connectors 136 may be less than the height H2 of the packaged semiconductor device 400, and the support substrate 135 may comprise a cavity to accommodate the packaged semiconductor device 400.

FIG. 11 illustrates a cross-sectional view of intermediate steps in the forming of the device package 5000. The device package 5000 is an alternative embodiment in which like reference numerals represent like components in the embodiment shown in FIGS. 1 through 9, unless specified otherwise. Accordingly, the process steps and applicable materials may not be repeated herein. The initial steps of this embodiment are essentially the same as shown in FIGS. 1 through 5. As shown in FIG. 11, a packaged semiconductor device 600 is placed on the conductive connectors 506 of the interconnect structure 300, making electrical connection between the packaged semiconductor device 600 and the routing structure 312 of the interconnect structure 300. The packaged semiconductor device 600 may be placed on the conductive connectors 506 using a placement process such as a pick-and-place process, or the like. Once in physical contact, a reflow process may be utilized to bond the conductive connectors 506 of the interconnect structure 300 to the packaged semiconductor device 600 through the front-side redistribution structure 530. In some embodiments, conductive connectors are formed on the packaged semiconductor device 600 instead of or in addition to the conductive connectors 506 formed on the interconnect structure 300. An underfill 503 may then be formed between the packaged semiconductor device 600 and the interconnect structure 300, surrounding the conductive connectors 506. In some embodiments, the conductive connectors 506 are not formed on the interconnect structure 300, and the packaged semiconductor device 600 is bonded to the interconnect structure 300 using a direct bonding technique such as thermocompression bonding, hybrid bonding, metal-to-metal bonding, or the like. However, any suitable bonding technique may be utilized.

Next, a debonding process of the carrier substrate 102 and formation of conductive connectors 404 on the contact pads 104, and the formation of conductive connectors 406 on the contact pads 106 of the redistribution structure 200 are performed. The process steps and applicable materials are essentially the same as those shown and described previously in FIG. 8. Accordingly, the process steps and applicable materials may not be repeated herein.

Still referring to FIG. 11, a packaged semiconductor device 600 is placed on the conductive connectors 404 of the redistribution structure 200, making electrical connection between the packaged semiconductor device 600 and the contact pads 104 of the redistribution structure 200 through the front-side redistribution structure 530. The packaged semiconductor device 600 may be placed on the conductive connectors 404 using a placement process such as a pick-and-place process, or the like. Once in physical contact, a reflow process may be utilized to bond the conductive connectors 404 of the redistribution structure 200 to the packaged semiconductor device 600. In some embodiments, conductive connectors are formed on the packaged semiconductor device 600 instead of or in addition to the conductive connectors 404 formed on the redistribution structure 200. The underfill 503 may then be formed between the packaged semiconductor device 600 and the redistribution structure 200, surrounding the conductive connectors 404. In some embodiments, the conductive connectors 404 are not formed on the redistribution structure 200, and the packaged semiconductor device 600 is bonded to the redistribution structure 200 using a direct bonding technique such as thermocompression bonding, hybrid bonding, metal-to-metal bonding, or the like. However, any suitable bonding technique may be utilized.

Next, one or more packaged semiconductor devices 600 are placed on the conductive connectors 406 of the redistribution structure 200, making electrical connection between the packaged semiconductor devices 600 and the contact pads 106 of the redistribution structure 200. The packaged semiconductor devices 600 may be placed on the conductive connectors 406 using a placement process such as a pick-and-place process, or the like. Once in physical contact, a reflow process may be utilized to bond the conductive connectors 406 of the redistribution structure 200 to the packaged semiconductor devices 600.

FIG. 12 illustrates a cross-sectional view of the device package 5000 in accordance with some embodiments. In FIG. 12, the structure shown in FIG. 11 is mounted on to a support substrate 135 (e.g., a printed circuit board (PCB)). The support substrate 135 may be a printed circuit board such as a laminate substrate formed as a stack of multiple thin layers (or laminates) of a polymer material such as bismaleimide triazine (BT), FR-4, ABF, or the like. However, any other suitable substrate, such as a silicon interposer, a silicon substrate, organic substrate, a ceramic substrate, or the like, may also be utilized. Conductive connectors 136 may be used to bond the support substrate 135 to the bond pads 322 of the interconnect structure 300 as illustrated in FIG. 12. The conductive connectors 136 may comprise metal pins that can be connected to socket connectors on the support substrate 135. The metal pins may be formed using an electroless nickel-electroless palladium-immersion gold technique (ENEPIG), or the like. The conductive connectors 136 may have a height H3 that is larger than a height H4 of the packaged semiconductor device 600 to allow the packaged semiconductor device 600 to be disposed between the support substrate 135 and the interconnect structure 300. In other embodiments, the conductive connectors 136 may be electroless nickel-electroless palladium-immersion gold technique (ENEPIG) formed bumps, or the like. In other embodiments, the conductive connectors 136 may include a conductive material such as solder, copper, copper pin, alloy pin, aluminum, gold, nickel, silver, palladium, tin, the like, or a combination thereof. The conductive connectors 136 may be first formed on either the support substrate 135, or the interconnect structure 300, and then reflowed to complete the bond. In such an embodiment, the height H3 of the conductive connectors 136 may be less than the height H4 of the packaged semiconductor device 600, and the support substrate 135 may comprise a cavity to accommodate the packaged semiconductor device 600.

FIG. 13 illustrates a cross-sectional view of intermediate steps in the forming of the device package 7500. The device package 7500 is an alternative embodiment in which like reference numerals represent like components in the embodiment shown in FIGS. 1 through 9, unless specified otherwise. Accordingly, the process steps and applicable materials may not be repeated herein. The initial steps of this embodiment are essentially the same as shown in FIGS. 1 through 2. Next, a mounting process is performed to place an interconnect structure 700 into electrical connection with the redistribution structure 200, and a molding process is performed to encapsulate the interconnect structure 700 attached to the redistribution structure 200, in accordance with some embodiments. The mounting process and the molding process are similar to those described earlier in FIGS. 4 and 5, unless specified otherwise. Accordingly, the process steps and applicable materials may not be repeated herein.

The interconnect structure 700 is formed in a separate process, and can be tested separately so that a known good interconnect structure 700 is used. The interconnect structure 700 is subsequently bonded to the redistribution structure 200. Like reference numerals in the interconnect structure 700 represent like components in the interconnect structure 300 (described previously in FIG. 3), unless specified otherwise. Accordingly, the process steps and applicable materials may not be repeated herein. During the formation of the interconnect structure 700, dielectric layers 314A-C and routing layers 315A-C may be formed adjacent to the routing layer 309 to form the routing structure 316, and dielectric layers 310A-C and routing layers 311A-C may be formed adjacent to the routing layer 308 to form the routing structure 312, according to some embodiments. In some embodiments, bond pads 322 and contact pads 107 are formed over and electrically connected to the routing layer 311C. Each of the bond pads 322 may comprise a land grid array (LGA) pad, or the like, configured to be mounted on a print circuit board (PCB). To form the bond pads 322, a photoresist (not shown) may be formed over the routing structure 312 and patterned. Next a conductive material may be formed through a deposition process such as electroplating, electroless plating, or the like. The conductive material may comprise a metal (e.g., nickel, gold, the like, or a combination thereof). Once the conductive material has been formed, the photoresist may be removed through a suitable removal process such as ashing or chemical stripping. In some embodiments, the bond pads 322 may have a pitch P6 that is in a range from about 200 µm to about 1000 µm. To form the contact pads 107, a photoresist (also not shown) may be formed and patterned to cover the routing structure 312, e.g., a spin coating technique. Once the photoresist has been formed and patterned, a conductive material may be formed that may be a material such as copper, titanium, tungsten, aluminum, another metal, the like, or a combination thereof. The conductive material may be formed through a deposition process such as electroplating, electroless plating, or the like. Once the conductive material has been formed, the photoresist may be removed through a suitable removal process such as ashing or chemical stripping.

Further, during the formation of the interconnect structure 700, a protection layer 320 is then formed over the routing structures 312 and 316 of interconnect structure 700. The protection layer 320 may comprise a solder resist material or a PBO material, and may be formed to protect the surfaces of the routing structures 312 or 316. In some embodiments, the protection layer 320 may be a photosensitive material formed by printing, lamination, spin-coating, or the like. The photosensitive material may then be exposed to an optical pattern and developed, forming openings in the photosensitive material that expose portions of the bond pads 322, the routing layer 315C, and the contact pads 107. In other embodiments, the protection layer 320 may be formed by depositing a non-photosensitive dielectric layer (e.g., silicon oxide, silicon nitride, the like, or a combination), forming a patterned photoresist mask over the dielectric layer using suitable photolithography techniques, and then etching the dielectric layer using the patterned photoresist mask using a suitable etching process (e.g., wet etching or dry etching). The protection layer 320 may be formed and patterned over the routing structure 312 and the routing structure 316 using the same techniques. Other processes and materials may also be used. In some embodiments, the interconnect structure 700 may be formed with one or both of the routing structures 312 and 316. In some embodiments, the interconnect structure 700 may be formed with the protection layer 320 formed and patterned over one or both of the routing structures 312 and 316.

After the mounting process is performed to place the interconnect structure 700 into electrical connection with the redistribution structure 200, and the molding process is performed to encapsulate the interconnect structure 700 attached to the redistribution structure 200, the conductive connectors 408 may be formed over the contact pads 107, making electrical connection to the interconnect structure 700. In some embodiments the conductive connectors 408 may be formed over the contact pads 107 before the interconnect structure 700 is bonded to the redistribution structure 200. In some embodiments, an optional solderability treatment (e.g., pre-soldering treatment) may be performed on the exposed surfaces of the contact pads 107 prior to forming the conductive connectors 408. The conductive connectors 408 may comprise ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 408 may comprise a conductive material such as solder, copper, aluminum, gold, nickel, silver, palladium, tin, the like, or a combination thereof. In some embodiments, the conductive connectors 408 are formed by initially forming a layer of solder through evaporation, electroplating, printing, solder transfer, ball placement, or the like. Once a layer of solder has been formed on the structure, a reflow may be performed in order to shape the material into the desired bump shapes. In some embodiments, the conductive connectors 408 may have a pitch P7 that is in a range from about 150 μm to about 1000 μm.

Next, one or more packaged semiconductor devices 600 are placed on the conductive connectors 408 of the interconnect structure 700, making electrical connection between the packaged semiconductor devices 600 and the contact pads 107 of the interconnect structure 700. Unless specified otherwise, like reference numerals in the packaged semiconductor device 600 represent like components in the packaged semiconductor device 600 described previously in FIG. 9. Accordingly, the process steps and applicable materials may not be repeated herein. The packaged semiconductor devices 600 may be placed on the conductive connectors 408 using a placement process such as a pick-and-place process, or the like. Once in physical contact, a reflow process may be utilized to bond the conductive connectors 408 of the interconnect structure 700 to the packaged semiconductor devices 600.

In FIG. 14, the carrier substrate 102 may be debonded from the redistribution structure 200 using, e.g., a thermal process to alter the adhesive properties of the adhesive layer 103 disposed on the carrier substrate 102. In a particular embodiment an energy source such as an ultraviolet (UV) laser, a carbon dioxide (CO2) laser, or an infrared (IR) laser, is utilized to irradiate and heat the adhesive layer 103 until the adhesive layer 103 loses at least some of its adhesive properties. Once performed, the carrier substrate 102 and the adhesive layer 103 may be physically separated and removed from the redistribution structure 200. Once the carrier substrate 102 and the adhesive layer 103 have been removed, the resulting structure may be flipped over and attached to a temporary substrate (not shown), such as a tape, wafer, panel, frame, ring, or the like for further processing.

FIG. 14 additionally illustrates a patterning of the polymer layer 105 in order to expose the contact pads 104 and the contact pads 106. In an embodiment, the polymer layer 105 may be patterned using, e.g., a laser drilling method. In such a method a protective layer, such as a light-to-heat conversion (LTHC) layer or a hogomax layer (not separately illustrated in FIG. 14) is first deposited over the polymer layer 105. Once protected, a laser is directed towards those portions of the polymer layer 105 which are desired to be removed in order to expose the underlying contact pads 104 and the contact pads 106.

In another embodiment, the polymer layer 105 may be patterned by initially applying a photoresist (not individually illustrated in FIG. 14) to the polymer layer 105 and then exposing the photoresist to a patterned energy source (e.g., a patterned light source) so as to induce a chemical reaction, thereby inducing a physical change in those portions of the photoresist exposed to the patterned light source. A developer is then applied to the exposed photoresist to take advantage of the physical changes and selectively remove either the exposed portion of the photoresist or the unexposed portion of the photoresist, depending upon the desired pattern, and the underlying exposed portion of the polymer layer 105 are removed with, e.g., a dry etch process. However, any other suitable method for patterning the polymer layer 105 may be utilized.

Once the contact pads 104 and the contact pads 106 have been exposed, the conductive connectors 404 may be formed over the contact pads 104, and the conductive connectors 406 may be formed over the contact pads 106 making electrical connection to the redistribution structure 200. In some embodiments, an optional solderability treatment (e.g., pre-soldering treatment) may be performed on the exposed surfaces of the contact pads 104 and the contact pads 106 prior to forming the conductive connectors 404 and 406. The conductive connectors 404 and the conductive connectors 406 may comprise ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 404 and 406 may comprise a conductive material such as solder, copper, aluminum, gold, nickel, silver, palladium, tin, the like, or a combination thereof. In some embodiments, the conductive connectors 404 and 406 are formed by initially forming a layer of solder through evaporation, electroplating, printing, solder transfer, ball placement, or the like. Once a layer of solder has been formed on the structure, a reflow may be performed in order to shape the material into the desired bump shapes. In some embodiments, the conductive connectors 406 may be similar to conductive connectors 408 (described previously in FIG. 13). In some embodiments, the conductive connectors 404 formed on the contact pads 104 and the conductive connectors 406 formed on the contact pads 106 may be different. For example, in an embodiment, the conductive connectors 404 formed on the contact pads 104 may comprise controlled collapse chip connection (C4) bumps and the conductive connectors 406 formed on the contact pads 106 may comprise ball grid array (BGA) connectors. In some embodiments, the conductive connectors 406 may have a pitch P8 that is in a range from about 150 μm to about 1000 μm.

Next, a packaged semiconductor device 800 is placed on the conductive connectors 404 of the redistribution structure 200, making electrical connection between the packaged semiconductor device 800 and the contact pads 104 of the redistribution structure 200. Unless specified otherwise, like reference numerals in the packaged semiconductor device 800 represent like components in the packaged semiconductor device 400 (described previously in FIGS. 7A and 7B). Accordingly, the process steps and applicable materials may not be repeated herein. The packaged semiconductor device 800 may be placed on the conductive connectors 404 using a placement process such as a pick-and-place process, or the like. The packaged semiconductor device 800 may include one or more devices, which may include devices designed for an intended purpose such as a memory die (e.g., a DRAM die, a stacked memory die, a high-bandwidth memory (HBM) die, etc.), a logic die, a central processing unit (CPU) die, an I/O die, a system-on-a-chip (SoC), a component on a wafer (CoW), an integrated fan-out structure (InFO), a package, the like, or a combination thereof. In an embodiment, the packaged semiconductor device 800 includes integrated circuit devices, such as transistors, capacitors, inductors, resistors, metallization layers, conductive connectors, and the like, therein, as desired for a particular functionality. In some embodiments, the packaged semiconductor device 800 may include more than one of the same type of device, or may include different devices. FIG. 14 shows three semiconductor devices encapsulated and connected with redistribution structures and contact pads, but in other embodiments one, two, or more than three semiconductor devices may be attached to the conductive connectors 404.

The packaged semiconductor device 800 shown in FIG. 14 may comprise a plurality of the integrated circuit devices 550 and 552. The integrated circuit devices 550 and 552 may each have a single function (e.g., a logic device, memory die, etc.), or may have multiple functions (e.g., a SoC). In an embodiment, the integrated circuit device 550 may be similar or different to the integrated circuit device 510 (described previously in FIG. 7). In an embodiment the integrated circuit devices 552 maybe similar or different to the integrated circuit devices 512 (described previously in FIGS. 7A and 7B). In an embodiment, the integrated circuit device 550 may comprise a CPU device, and the integrated circuit devices 552 may comprise I/O dies.

Still referring to FIG. 14, one or more packaged semiconductor devices 600 are placed on the conductive connectors 406 of the redistribution structure 200, making electrical connection between the packaged semiconductor devices 600 and the contact pads 106 of the redistribution structure 200. Unless specified otherwise, like reference numerals in the packaged semiconductor device 600 represent like components in the packaged semiconductor device 600 described previously in FIG. 9. Accordingly, the process steps and applicable materials may not be repeated herein. The packaged semiconductor devices 600 may be placed on the conductive connectors 406 using a placement process such as a pick-and-place process, or the like. Once in physical contact, a reflow process may be utilized to bond the conductive connectors 406 of the redistribution structure to the packaged semiconductor devices 600.

FIG. 15 illustrates a cross-sectional view of the device package 7500 in accordance with some embodiments. In FIG. 15, the structure shown in FIG. 14 is mounted on to a support substrate 135 (e.g., a printed circuit board (PCB)). The support substrate 135 may be a printed circuit board such as a laminate substrate formed as a stack of multiple thin layers (or laminates) of a polymer material such as bismaleimide triazine (BT), FR-4, ABF, or the like. However, any other suitable substrate, such as a silicon interposer, a silicon substrate, organic substrate, a ceramic substrate, or the like, may also be utilized. Conductive connectors 136 may be used to bond the support substrate 135 to the bond pads 322 of the interconnect structure 700 as illustrated in FIG. 15. The conductive connectors 136 may comprise metal pins that can be connected to socket connectors on the support substrate 135. The metal pins may be formed using an electroless nickel-electroless palladium-immersion gold technique (ENEPIG), or the like. The conductive connectors 136 may have a height H5 that is larger than a height H6 of the one or more packaged semiconductor devices 600 to allow the one or more packaged semiconductor devices 600 to be disposed between the support substrate 135 and the interconnect structure 300. In other embodiments, the conductive connectors 136 may be electroless nickel-electroless palladium-immersion gold technique (ENEPIG) formed bumps, or the like. In other embodiments, the conductive connectors 136 may include a conductive material such as solder, copper, copper pin, alloy pin, aluminum, gold, nickel, silver, palladium, tin, the like, or a combination thereof. The conductive connectors 136 may be first formed on either the support substrate 135, or the interconnect structure 300, and then reflowed to complete the bond. In such an embodiment, the height H5 of the conductive connectors 136 may be less than the height H6 of the packaged semiconductor devices 600, and the support substrate 135 may comprise one or more cavities to accommodate the packaged semiconductor devices 600.

The embodiments of the present disclosure have some advantageous features. The embodiments include the formation of a device package in which component devices (e.g., integrated fan-out (InFO) packages, chip-on-wafer (CoW) packages, or the like) are bonded on opposite sides of a core substrate to form a system on integrated substrate (SoIS). The core substrate may include an organic substrate, and the core substrate may be part of a pre-fabricated interconnect structure that comprises pre-soldered controlled collapse chip connection (C4) bumps. As a result, one or more embodiments disclosed herein may include the ability to electrically connect and integrate a higher number of component devices within the device package. In addition, because of the compact structure of the device package, the package components are closer to each other which results in better power and signal integrity with reduced transmission losses. This leads to better computing performance and allows the use of the device package in applications that require faster processing of data and performing of complex calculations at high speeds (e.g., High-Performance-Computing (HPC)).

In accordance with an embodiment, a method includes forming a redistribution structure on a carrier substrate; coupling a first side of a first interconnect structure to a first side of the redistribution structure using first conductive connectors, where the first interconnect structure includes a core substrate, where the first interconnect structure includes second conductive connectors on a second side of the first interconnect structure opposite the first side of the first interconnect structure; coupling a first semiconductor device to the second side of the first interconnect structure using the second conductive connectors; removing the carrier substrate; and coupling a second semiconductor device to a second side of the redistribution structure using third conductive connectors, where the second side of the redistribution structure is opposite the first side of the redistribution structure. In an embodiment, the core substrate includes an organic material. In an embodiment, coupling the first side of the first interconnect structure to the first side of the redistribution structure includes performing a reflow process on the first conductive connectors. In an embodiment, the coupling the first side of the first interconnect structure to the first side of the redistribution structure results in a first gap between the first interconnect structure and the redistribution structure. In an embodiment, the method further includes depositing an underfill material to fill the first gap between the first interconnect structure and the redistribution structure. In an embodiment, the underfill material physically contacts sidewalls of the first interconnect structure. In an embodiment, the method further includes forming fourth conductive connectors on the second side of the redistribution structure; and coupling a third semiconductor device to the second side of the redistribution structure using the fourth conductive connectors. In an embodiment, the first conductive connectors and the fourth conductive connectors include ball grid array (BGA) connectors and the second conductive connectors and the third conductive connectors include controlled collapse chip connection (C4) bumps. In an embodiment, a second pitch of the second conductive connectors is smaller than a first pitch of the first conductive connectors and a third pitch of the fourth conductive connectors.

In accordance with an embodiment, a method includes forming a redistribution structure on a carrier substrate, where a bottommost layer of the redistribution structure includes first contact pads and second contact pads, where the first contact pads have a different pitch than the second contact pads; mounting a first interconnect structure over the redistribution structure, where the first interconnect structure is electrically coupled to the redistribution structure through first conductive connectors on a first side of the first interconnect structure, where the first interconnect structure includes a core substrate, where the first interconnect structure includes second conductive connectors and bond pads on a second side of the first interconnect structure opposite the first side of the first interconnect structure; electrically coupling a first semiconductor device to the first interconnect structure through the second conductive connectors; and electrically coupling a second semiconductor device to the first contact pads of the redistribution structure through third conductive connectors, the first semiconductor device being located on an opposite side of the first interconnect structure than the second semiconductor device. In an embodiment, a first pitch of the bond pads and a second pitch of the second conductive connectors is different. In an embodiment, the method further includes coupling a printed circuit board to the bond pads of the first interconnect structure using fourth conductive connectors. In an embodiment, a first height of the fourth conductive connectors is larger than a second height of the first semiconductor device. In an embodiment, the method further includes electrically coupling a third semiconductor device to the first interconnect structure through the second conductive connectors, the first semiconductor device and the third semiconductor device being located on an opposite side of the first interconnect structure than the second semiconductor device. In an embodiment, the method further includes coupling a printed circuit board to the bond pads of the first interconnect structure using fifth conductive connectors, where the fifth conductive connectors are between the first semiconductor device and the third semiconductor device.

In accordance with an embodiment, a semiconductor package includes a redistribution structure; a first interconnect structure electrically connected to a first side of the redistribution structure, where the first interconnect structure includes a core substrate; an underfill material between the first interconnect structure and the redistribution structure; a first semiconductor package bonded to a second side of the redistribution structure; and a second semiconductor package bonded to the first interconnect structure, the second semiconductor package being located on an opposite side of the first interconnect structure than the first semiconductor package. In an embodiment, the underfill material further physically contacts sidewalls of the first interconnect structure. In an embodiment, further including a third semiconductor package bonded to the second side of the redistribution structure by first conductive connectors. In an embodiment, the first semiconductor package is bonded to the second side of the redistribution structure by second conductive connectors, and the second semiconductor package is bonded to the first interconnect structure by third conductive connectors, where a first pitch of the first conductive connectors is different from a second pitch of the second conductive connectors and the third conductive connectors. In an embodiment, further including a printed circuit board coupled to the first interconnect structure by fourth conductive connectors, where a first height of the fourth conductive connectors is larger than a second height of the second semiconductor package.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   coupling a first side of a first interconnect structure to a first side of a redistribution structure using first conductive connectors, wherein the first interconnect structure comprises a core substrate having conductive layers disposed on opposite surfaces, wherein the core substrate comprises an organic material;
coupling a first semiconductor device to a second side of the first interconnect structure using second conductive connectors; and
coupling a printed circuit board to the second side of the first interconnect structure using third conductive connectors, wherein a height of the third conductive connectors is larger than a height of the first semiconductor device.

2. The method of claim 1, further comprising coupling a second semiconductor device to a second side of the redistribution structure using fourth conductive connectors, wherein the second semiconductor device overlaps the first semiconductor device.

3. The method of claim 2, further comprising coupling a third semiconductor device to the second side of the redistribution structure using fifth conductive connectors, the third semiconductor device being adjacent to the second semiconductor device, and wherein the third semiconductor device overlaps at least one of the third conductive connectors.

4. The method of claim 3, wherein a first pitch of the second conductive connectors, and a second pitch of the fourth conductive connectors are smaller than a third pitch of the first conductive connectors and a fourth pitch of the fifth conductive connectors.

5. The method of claim 1, wherein the third conductive connectors comprise metal pins.

6. The method of claim 1, wherein after coupling the first side of the first interconnect structure to the first side of the redistribution structure, a gap is disposed between the first interconnect structure and the redistribution structure.

7. The method of claim 6, wherein the gap has a height that is in a range from 20 µm to 500 µm.

8. A semiconductor package comprising:
a first interconnect structure electrically coupled to a first side of a redistribution structure, the first interconnect structure comprising a core substrate, wherein the core substrate comprises an organic material;
a first semiconductor package bonded to a second side of the redistribution structure;
a second semiconductor package bonded to the first interconnect structure, wherein the first interconnect structure is disposed between the redistribution structure and the second semiconductor package; and
a support substrate coupled to the first interconnect structure by first conductive connectors and second conductive connectors, wherein the first conductive connectors and the second conductive connectors comprise metal pins, wherein a first conductive connector of the first conductive connectors is disposed adjacent to a first sidewall of the second semiconductor package, and a second conductive connector of the second conductive connectors is disposed adjacent to a second sidewall of the second semiconductor package.

9. The semiconductor package of claim 8, further comprising an underfill material disposed between the first interconnect structure and the redistribution structure.

10. The semiconductor package of claim 9, wherein the underfill material is in physical contact with sidewalls of the first interconnect structure.

11. The semiconductor package of claim 8, further comprising a third semiconductor package bonded to the second side of the redistribution structure.

12. The semiconductor package of claim 8, wherein top surfaces of the first conductive connectors are above a top surface of the second semiconductor package, and bottom surfaces of the first conductive connectors are below a bottom surface of the second semiconductor package.

13. A method comprising:
forming a redistribution structure on a carrier substrate;
coupling a first side of a first interconnect structure to a first side of the redistribution structure using first conductive connectors;
coupling a first semiconductor device to a center portion of a second side of the first interconnect structure using second conductive connectors;
coupling a second semiconductor device to a center portion of a second side of the redistribution structure using third conductive connectors; and
coupling a printed circuit board to the second side of the first interconnect structure using fourth conductive connectors and fifth conductive connectors, wherein the first semiconductor device is disposed between the fourth conductive connectors and the fifth conductive connectors.

14. The method of claim 13, further comprising coupling a third semiconductor device to the second side of the redistribution structure using sixth conductive connectors, wherein the third semiconductor device overlaps the fourth conductive connectors.

15. The method of claim 14, further comprising coupling a fourth semiconductor device to the second side of the redistribution structure using seventh conductive connectors, wherein the fourth semiconductor device overlaps the fifth conductive connectors.

16. The method of claim 15, wherein the fourth conductive connectors and the fifth conductive connectors comprise metal pins.

17. The method of claim 13, wherein a height of the fourth conductive connectors and the fifth conductive connectors is larger than a height of the first semiconductor device.

18. The method of claim 13, further comprising:
after coupling the first side of the first interconnect structure to the first side of the redistribution structure, depositing an underfill material to fill a gap between the first interconnect structure and the redistribution structure.

19. The method of claim 18, wherein after depositing the underfill material to fill the gap, the underfill material is in physical contact with sidewalls of the first interconnect structure.

20. The method of claim 19, wherein the gap has a height that is in a range from 20 µm to 500 µm.

* * * * *